US011200945B2

(12) United States Patent
Kubo et al.

(10) Patent No.: US 11,200,945 B2
(45) Date of Patent: Dec. 14, 2021

(54) SEMICONDUCTOR MEMORY DEVICE

(71) Applicant: ZENTEL JAPAN CORPORATION, Tokyo (JP)

(72) Inventors: Takashi Kubo, Tokyo (JP); Masaru Haraguchi, Tokyo (JP); Takeshi Hamamoto, Tokyo (JP); Kenichi Yasuda, Tokyo (JP); Yasuhiko Tsukikawa, Tokyo (JP); Hironori Iga, Tokyo (JP)

(73) Assignee: ZENTEL JAPAN CORPORATION, Tokyo (JP)

( * ) Notice: Subject to any disclaimer, the term of this patent is extended or adjusted under 35 U.S.C. 154(b) by 87 days.

(21) Appl. No.: 16/481,259

(22) PCT Filed: Jan. 31, 2017

(86) PCT No.: PCT/JP2017/003446
§ 371 (c)(1),
(2) Date: Jul. 26, 2019

(87) PCT Pub. No.: WO2018/142478
PCT Pub. Date: Aug. 9, 2018

(65) Prior Publication Data
US 2019/0378561 A1 Dec. 12, 2019

(51) Int. Cl.
*G11C 11/4096* (2006.01)
*G11C 11/408* (2006.01)
(Continued)

(52) U.S. Cl.
CPC ...... *G11C 11/4096* (2013.01); *G11C 11/4085* (2013.01); *G11C 11/4091* (2013.01);
(Continued)

(58) Field of Classification Search
None
See application file for complete search history.

(56) References Cited

U.S. PATENT DOCUMENTS 5,440,517 A 8/1995 Morgan et al.
6,144,597 A 11/2000 Kim
(Continued)

FOREIGN PATENT DOCUMENTS

JP 7-192460 A 7/1995
JP 8-31168 A 2/1996
(Continued)

OTHER PUBLICATIONS

International Search Report in the parent PCT application No. PCT/JP2017/003446, dated Mar. 7, 2017.
(Continued)

*Primary Examiner* — Charles Rones
*Assistant Examiner* — Jonah C Krieger
(74) *Attorney, Agent, or Firm* — Chen Yoshimura LLP

(57) ABSTRACT

A plurality of memory cells are arranged along a plurality of bit lines and a plurality of word lines. A sense amplifier is connected to each of the bit lines. Arranged along each bit line are at least four memory cells including first to fourth memory cells that are either connected to or disconnected from one of the bit lines by means of first to fourth switching elements according to an active or inactive state of first to fourth word lines. The first memory cell stores a first bit value, the second memory cell stores a second bit value, and the third and fourth memory cells each store a third bit value. A memory cell array control circuit activates and then deactivates the third and fourth word lines, subsequently activates the first and second word lines, and then activates the sense amplifier.

21 Claims, 20 Drawing Sheets

(51) Int. Cl.
*G11C 11/4091* (2006.01)
*G11C 29/00* (2006.01)
*H01L 27/108* (2006.01)

(52) U.S. Cl.
CPC ...... *G11C 29/702* (2013.01); *H01L 27/10805* (2013.01); *H01L 27/10885* (2013.01); *H01L 27/10891* (2013.01); *H01L 27/10897* (2013.01)

(56) References Cited

U.S. PATENT DOCUMENTS

| | | | | |
|---|---|---|---|---|
| 2015/0029798 | A1* | 1/2015 | Manning | G11C 7/1048<br>365/189.07 |
| 2015/0309743 | A1* | 10/2015 | Sohn | G11C 5/025<br>711/105 |
| 2017/0236568 | A1* | 8/2017 | Rho | G11C 7/12<br>711/105 |

FOREIGN PATENT DOCUMENTS

| | | | |
|---|---|---|---|
| JP | 2000-011694 | A | 1/2000 |
| JP | 2000-035878 | A | 2/2000 |
| JP | 2016532919 | A | 10/2016 |
| JP | 2016532920 | A | 10/2016 |

OTHER PUBLICATIONS

IPRP in the parent PCT application No. PCT/JP2017/003446, dated Aug. 6, 2019.

Balasubramonian et al, “Near-Data Processing: Insights from a Micro-46 Workshop”, IEEE Computer Society, IEEE Micro, vol. 34, Issue 4, pp. 36-42, Jul.-Aug. 2014.

Shiu et al, “System Challenges and Hardware Requirements for Future Consumer Devices: From wearable to ChromeBooks and devices in-between”, 2015 Symposium on VLSI Technology, 2015, pp. 1-5.

Seshadri et al, “Fast Bulk Bitwise and and or in DRAM”, IEEE Computer Architecture Letters, vol. 14, Issue 2, pp. 127-131, 2015.

* cited by examiner

FIG.5

| COMMAND | NAME | DESCRIPTION |
| --- | --- | --- |
| ACT | ACTIVE | ACTIVATE ONE WORD LINE, AND ACTIVATE SENSE AMPLIFIER |
| ACT2 | ACTIVE 2 | ACTIVATE TWO WORD LINES, AND ACTIVATE SENSE AMPLIFIER |
| WLA | WORD LINE ACTIVE | ACTIVATE ONE WORD LINE |
| WLA2 | WORD LINE ACTIVE 2 | ACTIVATE TWO WORD LINES |
| PCG | PRECHARGE | PRECHARGE BIT LINE, AND DEACTIVATE WORD LINE AND SENSE AMPLIFIER |
| WLP | WORD LINE PRECHARGE | DEACTIVATE WORD LINE |

| SDRAM COMMAND | CS | CA0 | CA1 | CA2 | CA3 | CA4 | CA5 |
|---|---|---|---|---|---|---|---|
| Activate-1 (ACT-1) | H | H | L | R12 | R13 | R14 | R15 |
| | L | BA0 | BA1 | BA2 | V | R10 | R11 |
| Activate-2 (ACT-2) | H | H | H | R6 | R7 | R8 | R9 |
| | L | R0 | R1 | R2 | R3 | R4 | R5 |

| SDRAM COMMAND | CS | CA0 | CA1 | CA2 | CA3 | CA4 | CA5 |
|---|---|---|---|---|---|---|---|
| Activate-1 (ACT-1) | H | H | L | R12 | R13 | R14 | S0 |
| | L | BA0 | BA1 | BA2 | S1 | R10 | R11 |
| Activate-2 (ACT-2) | H | H | H | R6 | R7 | R8 | R9 |
| | L | R0 | R1 | R2 | R3 | R4 | R5 |

| SDRAM COMMAND | CS | CA0 | CA1 | CA2 | CA3 | CA4 | CA5 |
|---|---|---|---|---|---|---|---|
| Active Select (ASEL) | H | L | H | H | H | H | V |
| | L | S0 | S1 | V | | | |
| Activate-1 (ACT-1) | H | H | L | R12 | R13 | R14 | R15 |
| | L | BA0 | BA1 | BA2 | V | R10 | R11 |
| Activate-2 (ACT-2) | H | H | H | R6 | R7 | R8 | R9 |
| | L | R0 | R1 | R2 | R3 | R4 | R5 |

| SDRAM COMMAND | CS | CA0 | CA1 | CA2 | CA3 | CA4 | CA5 |
|---|---|---|---|---|---|---|---|
| Active Select-1 (ASEL-1) | H | L | H | H | H | H | R15 |
| | L | BA0 | BA1 | BA2 | R12 | R13 | R14 |
| Active Select-2 (ASEL-2) | H | L | H | L | H | L | R11 |
| | L | R5 | R6 | R7 | R8 | R9 | R10 |
| Active Select-3 (ASEL-3) | H | L | H | L | H | H | R4 |
| | L | S0 | S1 | R0 | R1 | R2 | R3 |

FIG.22A

MR26 REGISTER INFORMATION (MA[7:0]=1A)

| OP[7] | OP[6] | OP[5] | OP[4] | OP[3] | OP[2] | OP[1] | OP[0] |
|---|---|---|---|---|---|---|---|
| RA<15> | RA<14> | RA<13> | RA<12> | RA<11> | RA<10> | RA<9> | RA<8> |

| FUNCTION | REGISTER TYPE | OPERAND | DATA |
|---|---|---|---|
| ROW ADDRESS | READ | OP[7:0] | SPECIFY BOUNDARIES BETWEEN MEMORY CELL ARRAYS BY ROW ADDRESS <15:8> |

FIG.22B

MR27 REGISTER INFORMATION (MA[7:0]=1B)

| | | | | | | | |
|---|---|---|---|---|---|---|---|
| OP[7] | OP[6] | OP[5] | OP[4] | OP[3] | OP[2] | OP[1] | OP[0] |
| RA<7> | RA<6> | RA<5> | RA<4> | RA<3> | RA<2> | RA<1> | RA<0> |

| FUNCTION | REGISTER TYPE | OPERAND | DATA |
|---|---|---|---|
| ROW ADDRESS | READ | OP[7:0] | SPECIFY BOUNDARIES BETWEEN MEMORY CELL ARRAYS BY ROW ADDRESS <7:0> |

FIG.23

BIT LINE DIRECTION

RECORD NAME

KEY ITEM

| | A | B | C | D | E | F | G | H | I | J |
|---|---|---|---|---|---|---|---|---|---|---|
| 0 | 1 | 1 | 0 | 1 | 1 | 0 | 1 | 1 | 1 | 0 |
| 1 | 1 | 0 | 1 | 0 | 0 | 1 | 0 | 0 | 1 | 0 |
| 2 | 0 | 0 | 0 | 1 | 1 | 1 | 1 | 0 | 1 | 1 |
| 3 | 1 | 1 | 1 | 0 | 0 | 0 | 1 | 0 | 1 | 0 |
| 4 | 1 | 0 | 0 | 1 | 1 | 1 | 0 | 1 | 1 | 1 |
| 5 | 0 | 1 | 1 | 0 | 0 | 1 | 1 | 1 | 1 | 1 |
| 6 | 0 | 0 | 0 | 0 | 1 | 0 | 1 | 0 | 1 | 0 |
| 7 | 0 | 1 | 1 | 1 | 1 | 1 | 0 | 1 | 1 | 0 |
| 8 | 1 | 1 | 0 | 1 | 0 | 1 | 1 | 1 | 0 | 1 |
| 9 | 1 | 1 | 1 | 0 | 1 | 1 | 0 | 0 | 1 | 1 |

WORD LINE DIRECTION

FIG.25

RECORD NAME

BIT LINE DIRECTION ↑

KEY ITEM

| | A | B | C | D | E | F | G | H | I | J | X |
|---|---|---|---|---|---|---|---|---|---|---|---|
| 0 | 1 | 1 | 0 | 1 | 1 | 0 | 1 | 1 | 1 | 0 | 1 |
| 1 | 1 | 0 | 1 | 0 | 0 | 1 | 0 | 0 | 1 | 0 | 0 |
| 2 | 0 | 0 | 0 | 1 | 1 | 1 | 1 | 0 | 1 | 1 | 1 |
| 3 | 1 | 1 | 1 | 0 | 0 | 0 | 1 | 0 | 1 | 0 | 0 |
| 4 | 1 | 0 | 0 | 1 | 1 | 1 | 0 | 1 | 1 | 1 | 1 |
| 5 | 0 | 1 | 1 | 0 | 0 | 1 | 1 | 1 | 1 | 1 | 0 |
| 6 | 0 | 0 | 0 | 0 | 1 | 0 | 1 | 0 | 1 | 0 | 1 |
| 7 | 0 | 1 | 1 | 1 | 1 | 1 | 0 | 1 | 1 | 0 | 1 |
| 8 | 1 | 1 | 0 | 1 | 0 | 1 | 1 | 1 | 0 | 1 | 0 |
| 9 | 1 | 1 | 1 | 0 | 1 | 1 | 0 | 0 | 1 | 1 | 1 |

WORD LINE DIRECTION ←

FIG.26

RECORD NAME

BIT LINE DIRECTION ↑

KEY ITEM

| | A | B | C | D | E | F | G | H | I | J | X |
|---|---|---|---|---|---|---|---|---|---|---|---|
| 0 | 1 | 1 | 0 | 1 | 1 | 0 | 1 | 1 | 1 | 0 | 1 |
| 2 | 0 | 0 | 0 | 1 | 1 | 1 | 1 | 0 | 1 | 1 | 1 |
| 4 | 1 | 0 | 0 | 1 | 1 | 1 | 0 | 1 | 1 | 1 | 1 |
| 6 | 0 | 0 | 0 | 0 | 1 | 0 | 1 | 0 | 1 | 0 | 1 |
| 7 | 0 | 1 | 1 | 1 | 1 | 1 | 0 | 1 | 1 | 0 | 1 |
| 9 | 1 | 1 | 1 | 0 | 1 | 1 | 0 | 0 | 1 | 1 | 1 |
| 1 | 1 | 0 | 1 | 0 | 0 | 1 | 0 | 0 | 1 | 0 | 0 |
| 3 | 1 | 1 | 1 | 0 | 0 | 0 | 1 | 0 | 1 | 0 | 0 |
| 5 | 0 | 1 | 1 | 0 | 0 | 1 | 1 | 1 | 1 | 1 | 0 |
| 8 | 1 | 1 | 0 | 1 | 0 | 1 | 1 | 1 | 0 | 1 | 0 |

WORD LINE DIRECTION ←

FIG.27

RECORD NAME

BIT LINE DIRECTION

| | A | B | C | D | E | F | G | H | I | J | X |
|---|---|---|---|---|---|---|---|---|---|---|---|
| 0 | 1 | 1 | 0 | 1 | 1 | 0 | 1 | 1 | 1 | 0 | 1 |
| 1 | 1 | 0 | 1 | 0 | 0 | 1 | 0 | 0 | 1 | 0 | 0 |
| 2 | 0 | 0 | 0 | 1 | 1 | 1 | 1 | 0 | 1 | 1 | 1 |
| 3 | 1 | 1 | 1 | 0 | 0 | 0 | 1 | 0 | 1 | 0 | 0 |
| 4 | 1 | 0 | 0 | 1 | 1 | 1 | 0 | 1 | 1 | 1 | 1 |
| 5 | 0 | 1 | 1 | 0 | 0 | 1 | 1 | 1 | 1 | 1 | 0 |
| 6 | 0 | 0 | 0 | 0 | 1 | 0 | 1 | 0 | 1 | 0 | 1 |
| 7 | 0 | 1 | 1 | 1 | 1 | 1 | 0 | 1 | 1 | 0 | 1 |
| 8 | 1 | 1 | 0 | 1 | 0 | 1 | 1 | 1 | 0 | 1 | 0 |
| 9 | 1 | 1 | 1 | 0 | 1 | 1 | 0 | 0 | 1 | 1 | 1 |
| /0 | 0 | 0 | 1 | 0 | 0 | 1 | 0 | 0 | 0 | 1 | |
| /1 | 0 | 1 | 0 | 1 | 1 | 0 | 1 | 1 | 0 | 1 | |
| /2 | 1 | 1 | 1 | 0 | 0 | 0 | 0 | 1 | 0 | 0 | |
| /3 | 0 | 0 | 0 | 1 | 1 | 1 | 0 | 1 | 0 | 1 | |
| /4 | 0 | 1 | 1 | 0 | 0 | 0 | 1 | 0 | 0 | 0 | |
| /5 | 1 | 0 | 0 | 1 | 1 | 0 | 0 | 0 | 0 | 0 | |
| /6 | 1 | 1 | 1 | 1 | 0 | 1 | 0 | 1 | 0 | 1 | |
| /7 | 1 | 0 | 0 | 0 | 0 | 0 | 1 | 0 | 0 | 1 | |
| /8 | 0 | 0 | 1 | 0 | 1 | 0 | 0 | 0 | 1 | 0 | |
| /9 | 0 | 0 | 0 | 1 | 0 | 0 | 1 | 1 | 0 | 0 | |

KEY ITEM (rows 0–9)

REVERSE KEY ITEM (rows /0–/9)

WORD LINE DIRECTION

FIG.28

RECORD NAME

BIT LINE DIRECTION

| | A | B | C | D | E | F | G | H | I | J | X |
|---|---|---|---|---|---|---|---|---|---|---|---|
| 0 | 0 | 0 | 1 | 0 | 0 | 1 | 0 | 0 | 0 | 1 | 1 |
| 1 | 1 | 0 | 1 | 0 | 0 | 1 | 0 | 0 | 1 | 0 | 0 |
| 2 | 1 | 1 | 1 | 0 | 0 | 0 | 0 | 1 | 0 | 0 | 1 |
| 3 | 1 | 1 | 1 | 0 | 0 | 0 | 1 | 0 | 1 | 0 | 0 |
| 4 | 0 | 1 | 1 | 0 | 0 | 0 | 1 | 0 | 0 | 0 | 1 |
| 5 | 0 | 1 | 1 | 0 | 0 | 1 | 1 | 1 | 1 | 1 | 0 |
| 6 | 1 | 1 | 1 | 1 | 0 | 1 | 0 | 1 | 0 | 1 | 1 |
| 7 | 1 | 0 | 0 | 0 | 0 | 0 | 1 | 0 | 0 | 1 | 1 |
| 8 | 1 | 1 | 0 | 1 | 0 | 1 | 1 | 1 | 0 | 1 | 0 |
| 9 | 0 | 0 | 0 | 1 | 0 | 0 | 1 | 1 | 0 | 0 | 1 |

KEY ITEM

WORD LINE DIRECTION

FIG.29

BIT LINE DIRECTION

RECORD NAME

KEY ITEM

| | A | B | C | D | E | F | G | H | I | J |
|---|---|---|---|---|---|---|---|---|---|---|
| 0 | 1 | 1 | 0 | 1 | 1 | 0 | 1 | 1 | 1 | 0 |
| 1 | 0 | 1 | 0 | 1 | 1 | 0 | 1 | 1 | 0 | 1 |
| 2 | 0 | 0 | 0 | 1 | 1 | 1 | 1 | 0 | 1 | 1 |
| 3 | 0 | 0 | 0 | 1 | 1 | 1 | 0 | 1 | 0 | 1 |
| 4 | 1 | 0 | 0 | 1 | 1 | 1 | 0 | 1 | 1 | 1 |
| 5 | 1 | 0 | 0 | 1 | 1 | 0 | 0 | 0 | 0 | 0 |
| 6 | 0 | 0 | 0 | 0 | 0 | 0 | 1 | 0 | 1 | 0 |
| 7 | 0 | 1 | 1 | 1 | 1 | 1 | 0 | 1 | 1 | 0 |
| 8 | 0 | 0 | 1 | 0 | 1 | 0 | 0 | 0 | 1 | 0 |
| 9 | 1 | 1 | 1 | 0 | 1 | 1 | 0 | 0 | 1 | 1 |

WORD LINE DIRECTION

FIG.30

BIT LINE DIRECTION

RECORD NAME

ROW

| | A | B | C | D | E | F | G | H | I | J |
|---|---|---|---|---|---|---|---|---|---|---|
| 0 | 1 | 1 | 0 | 1 | 1 | 0 | 1 | 1 | 1 | 0 |
| 1 | 0 | 1 | 0 | 1 | 1 | 0 | 1 | 1 | 0 | 1 |
| 2 | 0 | 0 | 0 | 1 | 1 | 1 | 1 | 0 | 1 | 1 |
| 3 | 0 | 0 | 0 | 1 | 1 | 1 | 0 | 1 | 0 | 1 |
| 4 | 1 | 0 | 0 | 1 | 1 | 1 | 0 | 1 | 1 | 1 |
| 5 | 1 | 0 | 0 | 1 | 1 | 0 | 0 | 0 | 0 | 0 |
| 6 | 0 | 0 | 0 | 0 | 0 | 0 | 1 | 0 | 1 | 0 |
| 7 | 0 | 1 | 1 | 1 | 1 | 1 | 0 | 1 | 1 | 0 |
| 8 | 0 | 0 | 1 | 0 | 1 | 0 | 0 | 0 | 1 | 0 |
| 9 | 1 | 1 | 1 | 0 | 1 | 1 | 0 | 0 | 1 | 1 |
| 10 | 1 | 1 | 1 | 1 | 1 | 1 | 1 | 1 | 1 | 1 |
| 11 | 0 | 0 | 0 | 0 | 0 | 0 | 0 | 0 | 0 | 0 |
| 12 | 0 | 0 | 0 | 0 | 0 | 0 | 0 | 0 | 0 | 0 |
| 13 | 0 | 0 | 0 | 0 | 0 | 0 | 0 | 0 | 0 | 0 |
| 14 | 0 | 0 | 0 | 0 | 0 | 0 | 0 | 0 | 0 | 0 |
| 15 | 0 | 0 | 0 | 0 | 0 | 0 | 0 | 0 | 0 | 0 |
| 16 | 0 | 0 | 0 | 0 | 0 | 0 | 0 | 0 | 0 | 0 |
| 17 | 0 | 0 | 0 | 0 | 0 | 0 | 0 | 0 | 0 | 0 |
| 18 | 0 | 0 | 0 | 0 | 0 | 0 | 0 | 0 | 0 | 0 |
| 19 | 0 | 0 | 0 | 0 | 0 | 0 | 0 | 0 | 0 | 0 |
| 20 | 0 | 0 | 0 | 0 | 0 | 0 | 0 | 0 | 0 | 0 |

WORD LINE DIRECTION

FIG.31

BIT LINE DIRECTION

RECORD NAME

KEY ITEM

| | A | B | C | D | E | F | G | H | I | J |
|---|---|---|---|---|---|---|---|---|---|---|
| 0 | 1 | 1 | 0 | 1 | 1 | 0 | 1 | 1 | 1 | 0 |
| 1 | 0 | 1 | 0 | 1 | 1 | 0 | 1 | 1 | 0 | 1 |
| 2 | 0 | 0 | 0 | 1 | 1 | 1 | 1 | 0 | 1 | 1 |
| 3 | 0 | 0 | 0 | 1 | 1 | 1 | 0 | 1 | 0 | 1 |
| 4 | 1 | 0 | 0 | 1 | 1 | 1 | 0 | 1 | 1 | 1 |
| 5 | 1 | 0 | 0 | 1 | 1 | 0 | 0 | 0 | 0 | 0 |
| 6 | 0 | 0 | 0 | 0 | 0 | 0 | 1 | 0 | 1 | 0 |
| 7 | 0 | 1 | 1 | 1 | 1 | 1 | 0 | 1 | 1 | 0 |
| 8 | 0 | 0 | 1 | 0 | 1 | 0 | 0 | 0 | 1 | 0 |
| 9 | 1 | 1 | 1 | 0 | 1 | 1 | 0 | 0 | 1 | 1 |
| 10 | 1 | 1 | 1 | 1 | 1 | 1 | 1 | 1 | 1 | 1 |
| 11 | 1 | 1 | 1 | 1 | 1 | 1 | 1 | 1 | 1 | 1 |
| 12 | 1 | 1 | 1 | 1 | 1 | 1 | 1 | 1 | 1 | 1 |
| 13 | 1 | 1 | 1 | 1 | 1 | 1 | 1 | 1 | 1 | 1 |
| 14 | 1 | 1 | 0 | 1 | 1 | 1 | 1 | 1 | 1 | 1 |
| 15 | 0 | 0 | 0 | 1 | 1 | 1 | 0 | 1 | 1 | 1 |
| 16 | 0 | 0 | 0 | 1 | 1 | 0 | 0 | 0 | 1 | 0 |
| 17 | 0 | 0 | 0 | 1 | 1 | 0 | 0 | 0 | 1 | 0 |
| 18 | 0 | 0 | 0 | 0 | 1 | 0 | 0 | 0 | 0 | 0 |
| 19 | 0 | 0 | 0 | 0 | 1 | 0 | 0 | 0 | 0 | 0 |
| 20 | 0 | 0 | 0 | 0 | 0 | 0 | 0 | 0 | 0 | 0 |

WORD LINE DIRECTION

SEMICONDUCTOR MEMORY DEVICE

TECHNICAL FIELD

The present invention relates to a semiconductor memory device configured to perform the logical AND operation, logical OR operation, and the like on stored data. The present invention also relates to a method of manufacturing such a semiconductor memory device and a method of processing data using such a semiconductor memory device.

BACKGROUND ART

There has been growing interest in processing large and complex data called big data. Data stored in a memory device such as a DRAM is, after being transmitted to an arithmetic-logic operation device such as a CPU, processed, and then transmitted to the memory device again. When the amount of data to be processed becomes extremely large, the time required to transmit and receive data between the memory device and the arithmetic-logic operation device restricts the processing capacity of the system and increases the power consumption.

In order to solve such problems, several companies and research institutes have proposed the idea of reducing the time and power consumption for sending and receiving data by processing the data as close as possible to locations where data is stored, as proposed in Non-Patent Document 1.

Further, Non-Patent Document 2 and the like propose that if data are processed inside a memory device that stores the data, time and power will not be required for externally transmitting and receiving data in the first place.

In such a case, the most important consideration needs to be taken for providing an effective internal data processing method without compromising the advantages of memory devices such as DRAMs, which are inexpensive and have large capacity.

Patent Document 1 discloses a technique of copying of data in row units. This approach is very effective for initialization and to write zero as disclosed in Non-Patent Document 2.

Non-patent Document 3 illustrates an example in which this technique of copying of data in row units is applied to perform the logical AND operation or logical OR operation on a large amount of data.

Furthermore, Patent Documents 2 to 4 also disclose semiconductor memory devices capable of performing the logical AND operation, the logical OR operation, and the like on stored data.

RELATED-ART DOCUMENTS

Patent Documents

[Patent Document 1] U.S. Pat. No. 5,440,517

[Patent Document 2] Japanese Unexamined Patent Application Publication No. 7-192460

[Patent Document 3] Japanese Unexamined Patent Application Publication No. 2000-011694

[Patent Document 4] Japanese Unexamined Patent Application Publication No. 2000-035878

Non-Patent Documents

[Non-Patent Document 1] R. Balasubramonian et al, "Near-Data Processing: Insights from a MICRO-46 Workshop", IEEE Computer Society, IEEE Micro, Vol. 34, Issue 4, pp. 36-42, Aug. 6, 2014

[Non-Patent Document 2] E. Shiu et al, "System Challenges and Hardware Requirements for Future Consumer Devices", 2015 Symposium on VLSI Technology Digest of Technical Papers, 1-3 (Invited), pp. T6-T10, Jun. 16, 2015

[Non-Patent Document 3] V. Seshadri, et al, "Fast Bulk Bitwise AND and OR in DRAM", IEEE Computer Architecture Letters, Vol. 14, Issue 2, pp. 127-131, May 18, 2015

SUMMARY OF THE INVENTION

Problem to be Solved by the Invention

In conventional semiconductor memory devices which are capable of performing the logical AND operation or the logical OR operation on stored data, the differential voltage applied to a sense amplifier may be smaller than the differential voltage when the memory cells are fully charged during normal operation. When this voltage is reduced, bit errors may occur.

In addition, in conventional semiconductor memory devices which are capable of performing the logical AND operation or the logical OR operation on stored data, a circuit that activates word lines does not have a good compatibility with a typical word line decoding circuit.

For example, in Non-Patent Document 3, a special word line decoder region for the logical AND and the logical OR operation is provided; however, this will result in an increase in chip size.

Accordingly, it is an object of the present invention to provide a semiconductor memory device that provides a sense amplifier with a sufficient differential voltage, has a high compatibility with a circuit of the word line decoder of the DRAM, and is capable of performing the logical AND operation and the logical OR operation on stored data without the need for an extra circuit.

It is also an object of the present invention to provide a method of manufacturing such a semiconductor memory device and a method for processing data using such a semiconductor memory device.

Means to Solve the Problem

According to a first aspect of the present invention, a semiconductor memory device is provided. The semiconductor memory device comprises at least one memory cell array comprising a plurality of memory cells arranged along a plurality of word lines and a plurality of bit lines orthogonal to one another;

a plurality of switching elements for connecting or disconnecting each of the memory cells arranged along a corresponding word line of the word lines to or from a corresponding bit line of the bit lines in accordance with an active or inactive state of the corresponding word line;

a plurality of sense amplifiers connected to the plurality of bit lines, respectively; and a control circuit for activating or deactivating the word lines and the sense amplifiers, wherein at least four memory cells comprising first to fourth memory cells among the plurality of memory cells are arranged along a corresponding bit line of the bit lines, wherein the first to fourth memory cells are each connected to or disconnected from one bit line by first to fourth switching elements among the plurality of switching elements, in accordance with an active or inactive state of first to fourth word lines among the plurality of word lines, wherein the first memory cell stores a first bit value, the second memory cell stores a second bit value, and the third and fourth memory cells each store a third bit value, and wherein the control circuit activates the third and fourth word lines, then deactivates the third and fourth word lines, subsequently activates the first and second word lines, and then activates the corresponding sense amplifier so that a logical AND operation or a logical OR operation specified by the third bit value is performed on the first and second bit values.

According to a second aspect of the present invention, a semiconductor memory device is provided. The semiconductor memory device comprises at least one memory cell array comprising a plurality of memory cells arranged along a plurality of word lines and a plurality of bit lines orthogonal to one another, the plurality of bit lines comprising a plurality of first bit lines and a plurality of second bit lines;

a plurality of switching elements for connecting or disconnecting each of the memory cells arranged along a corresponding word line of the word lines to or from a corresponding first bit line of the first bit lines or a corresponding second bit line of the second bit lines arranged along the corresponding word line of the word lines, in accordance with an active or inactive state of the corresponding word line of the word lines;

a plurality of sense amplifiers each connected to one of the plurality of first bit lines and one of the plurality of second bit lines; and a control circuit for activating or deactivating the word lines and the sense amplifiers, wherein at least three memory cells comprising first to third memory cells among the plurality of memory cells are arranged along each of the first bit lines and each of the second bit lines, wherein the first and the second memory cells are each connected to or disconnected from the corresponding first bit line by first and second switching elements among the plurality of switching elements, in accordance with an active or inactive state of first and second word lines among the plurality of word lines, wherein the third memory cell is connected to or disconnected from the corresponding second bit line by a third switching element among the plurality of switching elements, in accordance with an active or inactive state of a third word line among the plurality of word lines, wherein the first memory cell stores a first bit value, the second memory cell stores a second bit value, and the third cell stores a third bit value, value, and wherein the control circuit activates the first to third word lines and then activates the corresponding sense amplifier so that a logical AND operation or a logical OR operation specified by one of the first to third bit values is performed on remaining two of the first to third bit values.

According to a third aspect of the present invention, in the semiconductor memory device according to the first or the second aspect, the control circuit receives a row address having a plurality of bits individually selecting from the plurality of word lines, and simultaneously activates or deactivates a predetermined plurality of word lines by ignoring at least one bit of the row address.

According to a fourth aspect of the present invention, in the semiconductor memory device according to the first or the second aspect, the control circuit, when the plurality of word lines are simultaneously activated, deactivates at least one of the plurality of word lines that are activated before activating the sense amplifier.

According to a fifth aspect of the present invention, in the semiconductor memory device according to any one of the first to the fourth aspects, the control circuit comprises a first active command for activating the sense amplifier after activating one of the plurality of word lines, and a second active command for activating the sense amplifier after activating at least two of the plurality of word lines, wherein the semiconductor memory device operates according to both the first active command and the second active command.

According to a sixth aspect of the present invention, in the semiconductor memory device according to any one of the first to the fifth aspects, the control circuit comprises a third active command that does not automatically activate the sense amplifier after activating one of the plurality of word lines, and a fourth active command that does not automatically activate the sense amplifier after activating at least two of the plurality of word lines.

According to a seventh aspect of the present invention, in the semiconductor memory device according to any one of the first to the sixth aspects, the control circuit simultaneously performs operations on bit values stored in a plurality of memory cells arranged along a predetermined number of bit lines.

According to an eighth aspect of the present invention, in the semiconductor memory device according to any one of the first to the seventh aspects, the plurality of bit lines comprise a plurality of first bit lines and a plurality of second bit lines, one sense amplifier among the plurality of sense amplifiers is connected to one of the plurality of first bit lines and one of the plurality of second bit lines, and the control circuit deactivates the sense amplifier after the sense amplifier generates the first bit value, subsequently precharges the first and second bit lines independently to change potentials of the first and the second bit line, and then activates the sense amplifier to generate a bit value obtained by inverting the first bit value.

According to a ninth aspect of the present invention, the semiconductor memory device according to any one of the first to the eighth aspects, comprises a plurality of memory cell arrays;

at least one sense amplifier array in which a plurality of sense amplifiers is arranged, the plurality of memory cell arrays being arranged such that one sense amplifier row is located between any two vertically adjacent memory cells; and a redundancy circuit comprising at least one word line, and a plurality of memory cells and a plurality of switching elements arranged along the at least one word line, in each of the memory cell arrays.

According to a tenth aspect of the present invention, in the semiconductor memory device according to the ninth aspect, when a failure in one memory cell array among the plurality of memory cell arrays is repaired by a redundancy circuit of the one memory cell array, the control circuit operates the one memory cell array as an arithmetic circuit, and when the failure in the one memory cell array is repaired by a redundancy circuit of another memory cell array, the control circuit stops the operation of the one memory cell array as the arithmetic circuit According to an eleventh aspect of the present invention, the semiconductor memory device according to the ninth or the tenth aspect, comprises a register storing a row address designating a position of one sense amplifier row between any two vertically adjacent memory cells among the plurality of memory cell arrays, wherein the register is readable from outside the semiconductor memory device.

According to a twelfth aspect of the present invention, in the semiconductor memory device according to any one of the first to the eleventh aspects, comprises a record comprising a plurality of bit values indicating at least one attribute is stored in a plurality of memory cells arranged along the bit lines, for each of the bit lines.

According to a thirteenth aspect of the present invention, in the semiconductor memory device according to the twelfth aspect, when a search key comprising a plurality of bit values is input, the control circuit performs a logical AND operation on the bit values stored in the memory cells corresponding to a position of a bit value "1" of the search key, and also performs a logical OR operation on the bit values stored in the memory cells corresponding to a position of a bit value "0" of the search key, so as to search for a record that matches the search key from the record stored in the semiconductor memory device.

According to a fourteenth aspect of the present invention, in the semiconductor memory device according to the twelfth aspect, when a search key comprising a plurality of bit values is input, the control circuit performs a logical XOR operation or a logical XNOR operation between the search key and the record stored in the semiconductor memory device, so as to search for a record that matches the search key from among the record stored in the semiconductor memory device.

According to a fifteenth aspect of the present invention, in the semiconductor memory device according to the twelfth aspect, when a search key comprising a plurality of bit values is input, the control circuit searches for a record that matches the search key from a first record stored in the semiconductor memory device, and generates, for each bit line, a second record comprising a plurality of bit values, indicating matching or mismatching between each bit of the first record and a corresponding bit of the search key, so as to determine a matching level between the first record and the search key.

According to a sixteenth aspect of the present invention, a method of manufacturing a semiconductor memory device is provided, where the semiconductor memory device comprises at least one memory cell array comprising a plurality of memory cells arranged along a plurality of bit lines and a plurality of word lines orthogonal to each other. The method comprises steps of:

forming the plurality of bit lines;

forming the plurality of word lines;

forming the plurality of memory cells;

forming a plurality of switching elements for connecting or disconnecting each of the memory cells arranged along a corresponding word line of the word lines to or from a corresponding bit line of the bit lines in accordance with an active or inactive state of the corresponding word line;

forming a plurality of sense amplifiers connected to the plurality of bit lines, respectively; and forming a control circuit for activating or deactivating each of the word lines and the sense amplifiers, wherein at least four memory cells comprising first to fourth memory cells among the plurality of memory cells are arranged along a corresponding bit line of the bit lines, wherein the first to fourth memory cells are each connected to or disconnected from one bit line by first to fourth switching elements among the plurality of switching elements, in accordance with active or inactive states of first to fourth word lines among the plurality of word lines, wherein the first memory cell stores a first bit value, the second memory cell stores a second bit value, and the third and fourth memory cells each store a third bit value, and wherein the control circuit activates the third and fourth word lines, then deactivates the third and fourth word lines, subsequently activates the first and second word lines, and then activates the corresponding sense amplifier so that a logical AND operation or a logical OR operation specified by the third bit value is performed on the first and second bit values.

According to a seventeenth aspect of the present invention, the method according to the sixteenth aspect, comprises forming a plurality of memory cell arrays and at least one sense amplifier row in which a plurality of sense amplifiers are arranged so that one sense amplifier row is positioned between any two vertically adjacent memory cells;

forming a redundancy circuit comprising at least one word line, a plurality of memory cells and a plurality of switching elements arranged along the at least one word line, in each of the memory cell arrays;

operating one of the memory cell arrays as an arithmetic circuit when a failure in the one memory cell array is repaired by a redundancy circuit of the one memory cell array; and stopping the operation of the one memory cell array as an arithmetic circuit when a failure in the one memory cell array among the plurality of memory cell arrays is repaired by a redundancy circuit of another memory cell array.

According to an eighteenth aspect of the present invention, a data processing method using the semiconductor memory device according to the first to the fifteenth aspects comprises storing a record comprising a plurality of bit values indicating at least one attribute in a plurality of memory cells arranged along the bit lines, for each of the bit lines.

According to a nineteenth aspect of the present invention, the method according to the eighteenth aspect, comprises receiving a search key comprising a plurality of bit values;

performing a logical multiplication operation on the bit value stored in the memory cells corresponding to a position of a bit values "1" of the search key, and performing a logical OR operation on the bit value stored in the memory cells corresponding to a positions of a bit values "0" of the search key.

According to a twentieth aspect of the present invention, the method according to the eighteenth aspect, comprises receiving a search key comprising a plurality of bit values; and performing a logical XOR operation or a logical XNOR operation between the search key and a record stored in the semiconductor memory device.

According to a twenty-first aspect of the present invention, the method according to the eighteenth aspect, comprises receiving a search key comprising a plurality of bit values; and searching for a record that matches the search key from a first record stored in the semiconductor memory device;

generating a second record comprising a plurality of bit values indicating matching or mismatching between each bit of the first record and a corresponding bit of the search key, for each of the bit lines; and sorting each bit of the second record to determine a matching level between the first record and the search key.

Advantageous Effect of the Invention

According to the present invention, a semiconductor memory device is provided. The semiconductor memory device capable of providing a sense amplifier with a sufficient differential voltage, has a high compatibility with the circuit of the word line decoder of the DRAM, and is capable of performing the logical AND operation and the logical OR operation on stored data without the need for extra circuit.

In addition, according to the present invention, a method of manufacturing such a semiconductor memory device and a method of data processing using such a semiconductor memory device can be provided.

BRIEF DESCRIPTION OF THE DRAWINGS

FIG. 5 is a table illustrating commands issued from a memory controller 2 to a DRAM chip 1 in FIG. 1;

FIG. 22A is a table illustrating a first portion of a mode register used by the DRAM chip according to the fourteenth embodiment;

FIG. 22B is a table illustrating a second portion of the mode register used by the DRAM chip according to the fourteenth embodiment;

FIG. 23 is a diagram illustrating examples of records stored in a memory cell array of a DRAM chip according to a fifteenth embodiment;

FIG. 25 is a diagram illustrating a record search with respect to records stored in the memory cell array of FIG. 23;

FIG. 26 is a diagram illustrating record search and sort with respect to records stored in the memory cell array of FIG. 23;

FIG. 27 is a diagram illustrating a record search with respect to records stored in a memory cell array of a DRAM chip according to a sixteenth embodiment;

FIG. 28 is a diagram illustrating results of the logical XOR operation between records stored in the memory cell array and a search key in FIG. 27;

FIG. 29 is a diagram illustrating results of determining matching and mismatching between records stored in a memory cell array of a DRAM chip according to a seventeenth embodiment and a search key;

FIG. 30 is a diagram illustrating an initial state of a process for determining a matching level between records stored in a memory cell array of the DRAM chip according to the seventeenth embodiment and the search key;

FIG. 31 is a diagram illustrating the results of determining a matching level between the records stored in the memory cell array of the DRAM chip according to the seventeenth embodiment and the search key.

MODE FOR CARRYING OUT THE INVENTION

Hereinafter, embodiments of the present invention will be described with reference to the drawings.

First Embodiment

Figure 1:
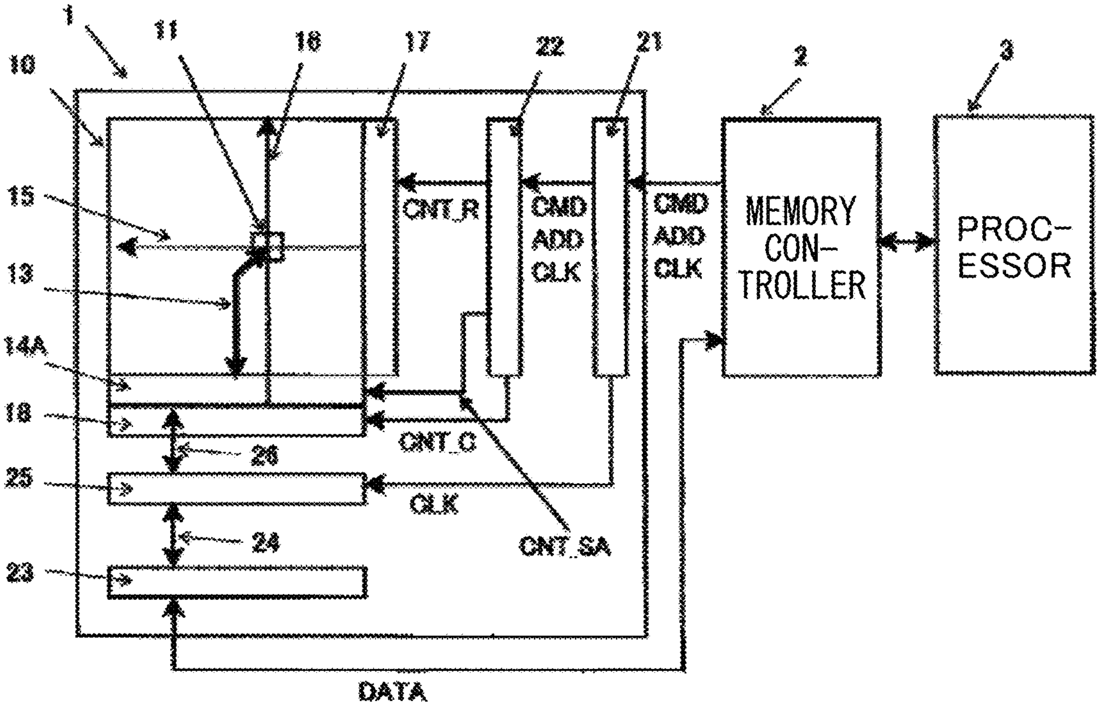
FIG. 1 is a block diagram illustrating a configuration of a data processing device comprising a DRAM chip 1 according to a first embodiment.

FIG. 1 is a block diagram illustrating a configuration of a data processing device comprising a DRAM chip 1 according to a first embodiment. The data processing device of FIG. 1 comprises a DRAM chip 1, a memory controller 2, and a processor 3.

DRAM chip 1 comprises a memory cell array 10, a command input circuit 21, a memory cell array control circuit 22, a data input/output circuit 23, an internal data bus 24, a data processing circuit 25, and an internal data bus 26.

The memory cell array 10 comprises a plurality of memory cells 11, a plurality of bit lines 13, a sense amplifier array 14A, a plurality of word lines 15, a plurality of column selection lines 16, a word line decoding circuit 17, and a column selection line decoding circuit 18. The plurality of memory cells 11 are arranged along the plurality of bit lines 13 and the plurality of word lines 15 orthogonal to one another. The memory cells 11 arranged along the word lines 15 are connected to or disconnected from the corresponding bit lines 13 by the switching elements operating in response to an active or inactive state of the word lines 15, as described below. The sense amplifier array 14A comprises a plurality of sense amplifiers 14 connected to the plurality of bit lines 13, respectively. The plurality of column selection lines 16 select one of the plurality of sense amplifiers 14 of the sense amplifier array 14A. The word line decoding circuit 17 decodes an address sent from the memory cell array control circuit 22 to a position of a word line to select one or more of the plurality of word lines 15. The column selection line decoding circuit 18 decodes an address sent from the memory cell array control circuit 22 to a position of a column selection line to select one or more of the plurality of column selection lines 16.

In FIG. 1, only one memory cell 11, one bit line 13, one word line 15, and one column selection line 16 are illustrated for simplicity of illustration.

The command input circuit 21 receives a command CMD, address ADD, and clock CLK from the memory controller 2 and sends the command CMD, address ADD, and clock CLK to the memory cell array control circuit 22, and also sends the clock CLK to the data processing circuit 25.

The memory cell array control circuit 22 receives the command CMD, address ADD, and clock CLK from the command input circuit 21 to generate control signals CNT_SA, CNT_R, and CNT_C for the sense amplifier array 14A, word line decoding circuit 17, and column selection line decoding circuit 18. The sense amplifier control signal CNT_SA for the sense amplifier array 14A comprises an address (or an address of each bit line 13) of each of the sense amplifiers of the sense amplifier array 14A to activate or deactivate the sense amplifiers of the sense amplifier array 14A. The row control signal CNT_R for the word line decoding circuit 17 comprises an address of each of the word lines 15 to activate or deactivate the word lines 15. The column control signal CNT_C for the column selection line decoding circuit 18 comprises an address of each of the column selection lines 16 to activate or deactivate the column selection lines 16. Thus, the memory cell array control circuit 22 is a control circuit that activates or deactivates each of the sense amplifiers, each of the word lines 15, and each of the column selection lines 16 of the sense amplifier array 14A.

The data input/output circuit 23 transmits to and receives from the memory controller 2 data signals DATA, and transmits to and receives from each sense amplifier of the sense amplifier array 14A data signals via an internal data bus 24, a data processing circuit 25, and an internal data bus 26.

The memory controller 2 transmits, under the control of the processor 3, the command CMD, the address ADD, and the clock CLK to the DRAM chip 1, and transmits to and receives from the DRAM chip 1 the data signal DATA.

Before describing the features of the DRAM chip 1 according to the first embodiment, an overview of operation of the DRAM chip 1 will be described with reference to FIGS. 1 to 3.

Figure 2:
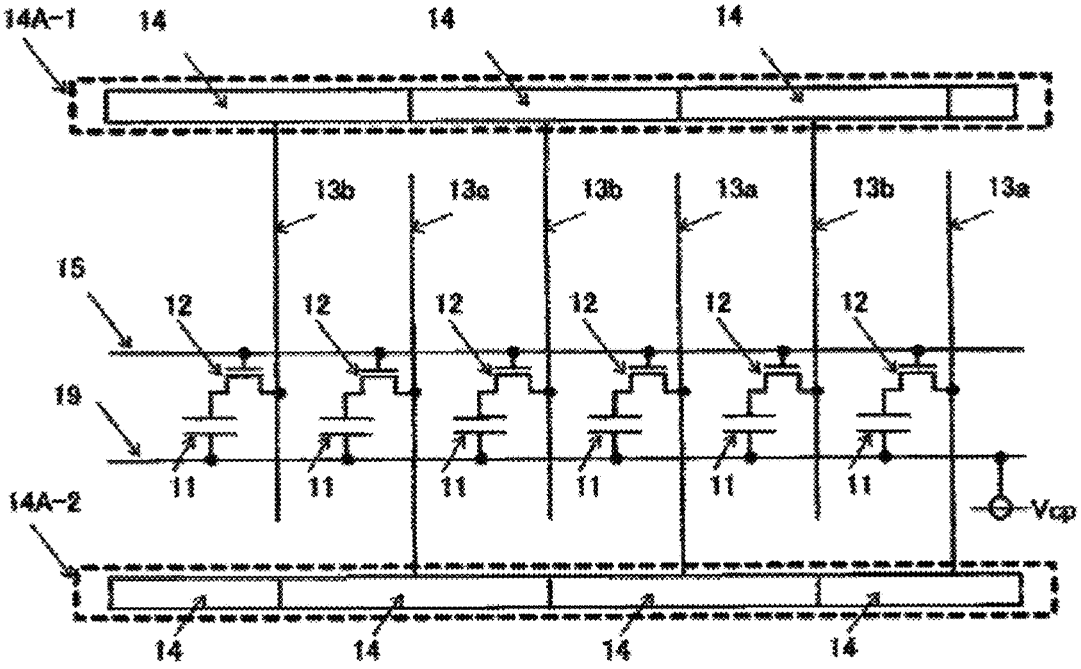
FIG. 2 is a schematic diagram illustrating access-to-row in a memory cell array 10 of FIG. 1.

FIG. 2 is a schematic diagram illustrating access to rows (hereinafter called "row access") in the memory cell array 10 of FIG. 1. FIG. 2 illustrates a portion of the memory cell array 10 of FIG. 1 associated with a plurality of memory cells 11 arranged along one word line 15. Each memory cell 11 is a capacitive element that stores charge. One end of each memory cell 11 is connected to a cell plate 19, and the other end of the memory cell 11 is connected to a bit line 13*a* or inverse bit line 13*b* by a switching element 12. The cell plate 19 is connected to a voltage source of cell plate potential Vcp, which is a grounding potential or other potential. A bit line 13*a* is connected to one of a plurality of sense amplifiers 14 of a sense amplifier row 14A-2, and an inverse bit line 13*b* is connected to one of a plurality of sense amplifiers 14 of a sense amplifier row 14A-1. Each switching element 12 is, for example, a transistor. Each switching element 12 connects or disconnects a corresponding one of the memory cells 11 arranged along the word line 15 with respect to a bit line 13*a* or inverse bit line 13*b*, according to the active or inactive state of the word line 15. In other words, respective switching elements 12 select a plurality of memory cells 11 arranged along one word line 15.

Referring to FIGS. 1 and 2, row access activates the word lines 15 to connect the memory cells 11 storing data to the bit lines 13, and small amounts of charge in the memory cells 11 reach the sense amplifiers 14 to amplify the charges to logical "1" or "0". Thereafter, column access activates the column selection line 16 so that some of the sense amplifiers 14 storing the data activated by the row access are selected and can be read as a data signal DATA through the data input/output circuit 23. Conversely, when a data signal DATA is input from an external source, data is written into the sense amplifier 14 designated by the column selection line 16, and the data of the sense amplifier 14 is then stored via the bit line 13 in a memory cell 11 corresponding to the activated word line 15.

The number of sense amplifiers 14 that are connected to the memory cells 11 via bit lines 13 during row access is set to a very large value to sufficiently increase the range that can be selected by column access called a page. As an example, in the case of 1 Gb, ×16 DDR3-SDRAM standardized in JEDEC, data selected using 0 to 9 bits of column address is input/output to 16 pins by a single row access. Accordingly, in the sense amplifiers 14, data of memory cells 11 as high as $2^{10}\times16=16$ kilobits are activated. Referring to FIG. 2, the sum of memory cells 11 selected by one word line 15 and the sense amplifiers 14 each storing a logical value of the corresponding memory cell reaches a few kilobits to tens of kilobits. However, when column access is performed in the same DDR3-SDRAM, the column data prefetches 8 bits and inputs or outputs the 8 bits with respect to 16 pins. Accordingly, the amount of data accessed by a single column activity remains at $8\times16=128$ bits. Accordingly, in DRAMs, to process data appearing on the sense amplifier 14 by row access as a unit may be very effective.

Figure 3:
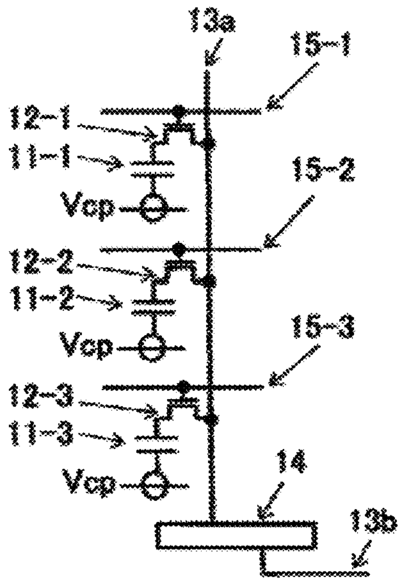
FIG. 3 is a circuit diagram illustrating one column circuit of a memory cell array according to a comparative example.

FIG. 3 is a circuit diagram illustrating one column circuit of a memory cell array according to a comparative example. FIG. 3 illustrates a portion of the memory cell array 10 of FIG. 1 associated with a plurality of memory cells 11 arranged along one bit line 13. The memory cell array of FIG. 3 comprises three memory cells 11-1 to 11-3, three switching elements 12-1 to 12-3, a bit line 13*a*, an inverse bit line 13*b*, a sense amplifier 14, and three word lines 15-1 to 15-3.

The sense amplifier 14 is connected to both bit line 13*a* and inverse bit line 13*b*. In this specification, a bit line 13*a* is also referred to as a "first bit line", and an inverse bit line 13*b* is also referred to as a "second bit line".

Referring now to FIG. 3, an illustration is given of a method of performing the logical AND operation or logical OR operation on a predetermined amount of data with row activity as a unit by simultaneously activating the three word lines 15-1 to 15-3 corresponding to the three memory cells 11-1 to 11-3 connected to one bit line 13*a*.

As an example, the logical OR operation is performed on bit values stored in memory cells 11-1 and 11-2. Suppose that voltage of memory cell 11-1 is "0" and voltage of memory cell 11-2 is "V", and voltage of memory cell 11-3 specifying the logical AND operation or logical OR operation is "V", before the activity of word lines 15-1 to 15-3. In this specification, the voltage "0" represents a bit value "0", and the voltage "V" represents a bit value "1". In this case, the bit line 13*a* and the inverse bit line 13*b* are precharged to a voltage "V/2". Subsequently, the word lines 15-1 to 15-3 are activated. Herein, it is supposed that where capacitance of each of bit lines 13*a* and 13*b* is represented by Cb and capacitance of each of memory cells 11-1 to 11-3 is represented by Cs, Cb=2Cs is obtained. In this case, after the redistribution of the charge, the voltage of the bit line 13*a* becomes "3V/5", and the voltage of the inverse bit line 13*b* is invariant at "V/2", so that the differential voltage supplied to the sense amplifier 14 is "3V/5-V/2=V/10". The differential voltage is amplified by the sense amplifier 14, and the bit line 13*a* is set to the voltage "V" and the inverse bit line 13*b* is set to the voltage "0". Accordingly, the operation of "bit value of memory cell 11-1" OR "bit value of memory cell 11-2"="0" OR "1"="1" is executed.

Since the normal operation of DRAM activates only one word line, the differential voltage is "V/6" after the charge is redistributed, based on similarly assuming Cb=2Cs in FIG. 3 when activates only word line 15-1. In a configuration that simultaneously activates the three word lines 15-1 to 15-3 to perform the logical AND or logical OR operation, the differential voltage with respect to the sense amplifier 14 is smaller than the differential voltage when the memory cell is fully charged during normal operation. This is because a circuit in which the three word lines 15-1 to 15-3 are activated has a larger memory cell capacitance for the subject to redistribution of charge, compared to a circuit in which only one word line is activated.

Next, features of the DRAM chip 1 of FIG. 1 will be described with reference to FIGS. 4 to 6.

Figure 4:
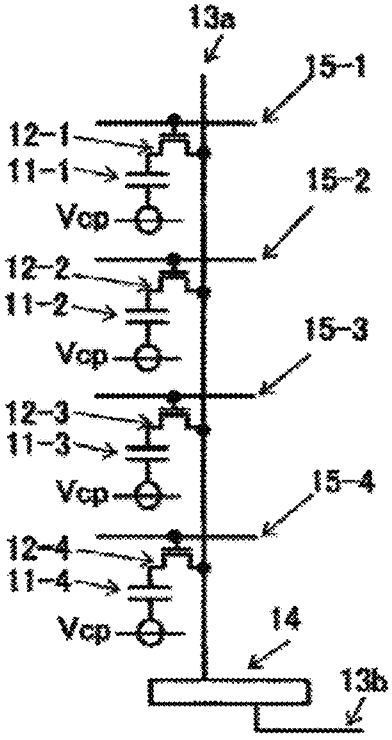
FIG. 4 is a circuit diagram illustrating one column circuit of the memory cell array 10 in FIG. 1.

FIG. 4 is a circuit diagram illustrating one column circuit of the memory cell array 10 in FIG. 1. FIG. 4 illustrates a portion of the memory cell array 10 of FIG. 1 associated with a plurality of memory cells 11 arranged along one word line 13. The memory cell array of FIG. 4 comprises four memory cells 11-1 to 11-4, four switching elements 12-1 to 12-4, a bit line 13*a*, an inverse bit line 13*b*, a sense amplifier 14, and four word lines 15-1 to 15-4.

The memory cell array 10 of FIG. 1 is capable of executing the logical AND operation and the logical OR operation on stored data. Referring to FIG. 4, at least four memory cells, comprising first to fourth memory cells 11-1 to 11-4, are arranged along a bit line 13*a*. The first to fourth memory cells 11-1 to 11-4 are each connected to or disconnected from a bit line 13*a* via first to fourth switching elements 12-1 to 12-4, according to the activity or inactivity of the first to fourth word lines 15-1 to 15-4. The first memory cell 11-1 stores a first bit value, the second memory cell 11-2 stores a second bit value, and the third and fourth memory cells 11-3 and 11-4 each store a third bit value. The first and second bit values are data for logical AND or logical OR operation, and the third bit value specifies an operation to be performed (logical AND or logical OR operation).

First, the memory cell array control circuit 22 activates word lines 15-3 and 15-4, and then deactivates the word lines 15-3 and 15-4. The memory cell array control circuit 22 then performs the operation by activating the word lines 15-1 and 15-2, and subsequently activating the sense amplifier 14. The memory cell array control circuit 22 then deactivates the word lines 15-1 and 15-2 to store the operation results.

For example, suppose that the memory cells 11-3 and 11-4 storing the voltage "V" specify the logical OR operation, and of the memory cells 11-1 and 11-2, the memory cell 11-1 stores the voltage "0" and the memory cell 11-2 stores the voltage "V". As in FIG. 3, it is supposed that where capacitance of each of bit lines 13*a* and 13*b* is represented by Cb and capacitance of each of the memory cells 11-1 to 11-4 is represented by Cs, Cb=2Cs is obtained. First, the memory cell array control circuit 22 activates word lines 15-3 and 15-4 to redistribute charge and then deactivates the word lines 15-3 and 15-4. The memory cell array control circuit 22 then activates word lines 15-1 and 15-2 to redistribute the charge. In this case, the differential voltage supplied to the sense amplifier 14 is "V/8", resulting in a greater voltage compared to the comparative example of FIG. 3. The sense amplifier 14 amplifies this voltage and obtains the result of the logical OR operation of memory cells 11-1 and 11-2.

Further, when the memory cells 11-3 and 11-4 store the voltage "0" to specify the logical AND operation, and when the memory cell 11-1 stores the voltage "0" and the memory cell 11-2 stores the voltage "V", the differential voltage of the sense amplifier 14 is "−V/8". The sense amplifier 14 amplifies this voltage to obtain results of the logical AND operation of memory cells 11-1 and 11-2.

Each of other column circuits of the memory cell array 10 is also configured similar to the column circuit of FIG. 4. Depending on the active or inactive state of the word lines 15, each memory cell 11 arranged along the corresponding word line 15 is connected to or disconnected from the bit line 13*a*. The memory cell array control circuit 22 simultaneously performs operation on bit values stored in a plurality of memory cells 11 arranged along a predetermined number of bit lines 13. Accordingly, the DRAM chip 1 of FIG. 1 can perform the logical OR operation and the logical AND operation by row access unit.

FIG. 5 is a table illustrating commands issued from a memory controller 2 to a DRAM chip 1 in FIG. 1. A command ACT is a first active command that activates one of the word lines 15 and then activates the sense amplifier 14. The command ACT is an active command for a DRAM defined by JEDEC. A command ACT2 is a second active command that activates two of the word lines 15 and then activates the sense amplifier 14. A command WLA is a third active command that activates one of the word lines 15 and then does not automatically activate the sense amplifier 14. A command WLA2 is a fourth active command that activates two of the word lines 15 and then does not automatically activate the sense amplifier 14. Command PCG and WLP are precharge commands for a DRAM defined by JEDEC.

The memory cell array control circuit 22 may operate according to, for example, both command ACT and ACT2. The memory cell array control circuit 22 may operate according to, for example, both command WLA and WLA2.

Figure 6:
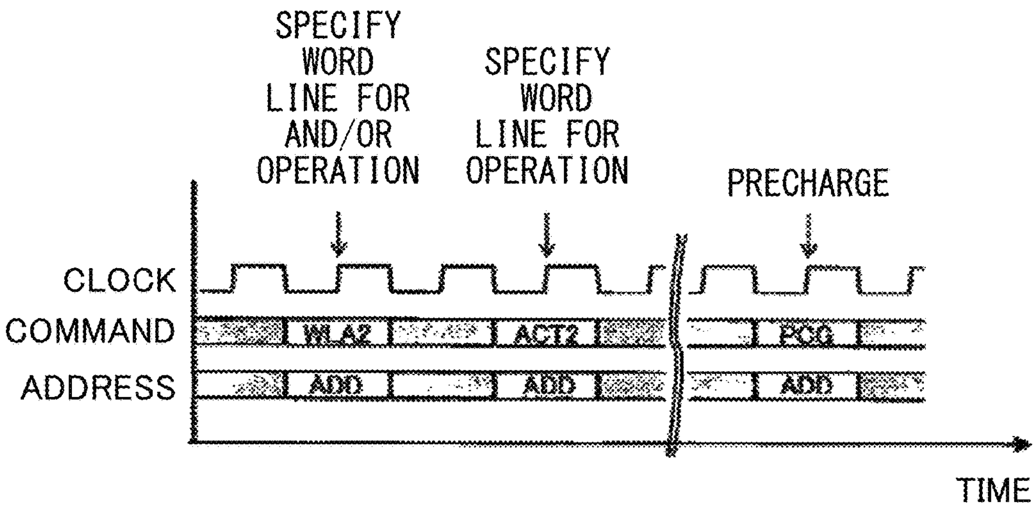
FIG. 6 is a timing chart illustrating operation of the column circuit of FIG. 4.

FIG. 6 is a timing chart illustrating operation of the column circuit of FIG. 4. In the operation of FIG. 6, the commands WLA2, ACT2, and PCG in FIG. 5 are used. First, the command WLA2 activates two word lines 15-3 and 15-4 corresponding to memory cells 11-3 and 11-4 storing bit values specifying the logical AND operation or logical OR operation. The command ACT2 then deactivates the two previously activated word lines 15-3 and 15-4 to activate the other two word lines 15-1 and 15-2 corresponding to the memory cells 11-1 and 11-2 storing the bit values subject to operation, and then activates the sense amplifier 14. In this manner, the logical AND operation or logical OR operation is executed according to the commands WLA2 and ACT2, and the row access is completed by the command PCG.

In a case where the word line decoding circuit has a configuration (FIG. 7) of a second embodiment, the two previously activated word lines 15 are deactivated simultaneously with activation of the two word lines 15 that are subsequently activated.

As described above, in the DRAM chip 1 according to the first embodiment, a sufficient differential voltage is supplied to the sense amplifier 14, a high compatibility is provided for the word line decoding circuit 17 of the DRAM chip 1, no extra circuit is required, and logical AND and the logical OR operation are performed on stored data.

Second Embodiment

Figure 7:
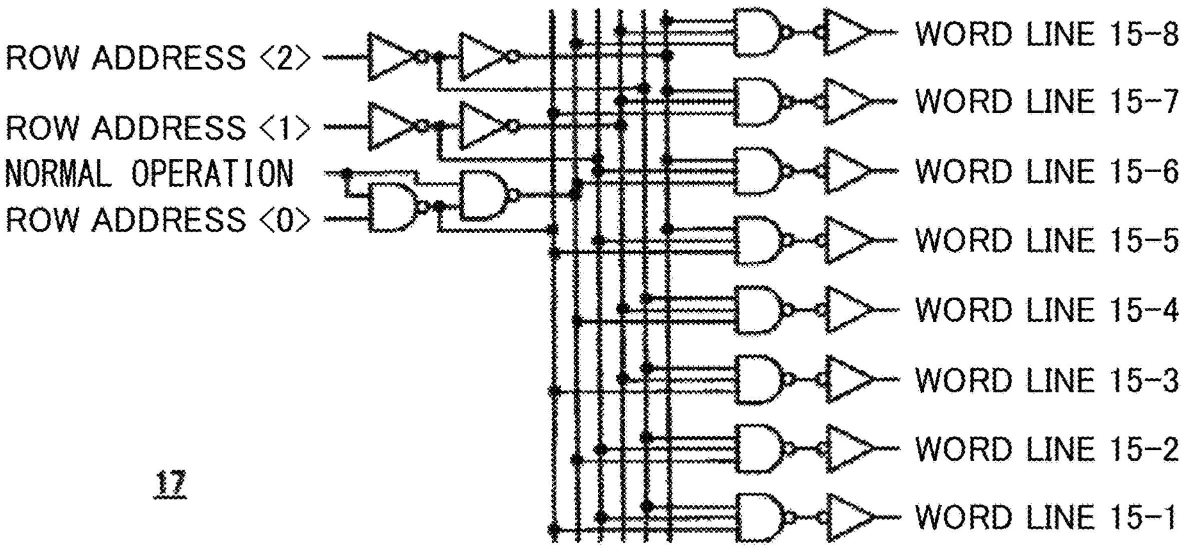
FIG. 7 is a circuit diagram illustrating a word line decoding circuit 17 of a DRAM chip according to the second embodiment.

FIG. 7 is a circuit diagram illustrating a word line decoding circuit 17 of a DRAM chip according to the second embodiment. FIG. 7 illustrates a portion of a word line decoding circuit 17 with a function of simultaneously activating and deactivating two word lines. The DRAM chip according to the second embodiment has a similar configuration as the configuration of the DRAM chip 1 according to the first embodiment, except for the word line decoding circuit 17.

The memory cell array control circuit 22 receives a plurality of bits of row addresses individually selecting a plurality of word lines from the command input circuit 21, and transmits the received bits of row addresses to the word line decoding circuit 17.

In the first embodiment, two of the plurality of word lines were simultaneously activated and deactivated to perform logical AND or logical OR operation. In general, specifying two word lines increases the amount of data in the address compared to specifying only one word line. In the second embodiment, an illustration is given of the word line decoding circuit 17 capable of specifying a plurality of word lines with a smaller amount of data than a conventional word line decoding circuit without a considerable change from the conventional word line decoding circuit.

The word line decoding circuit 17 of FIG. 7 is connected to eight word lines 15-1 to 15-8. These word lines 15-1 to 15-8 are addressed by a 3-bit row address.

Figure 8:
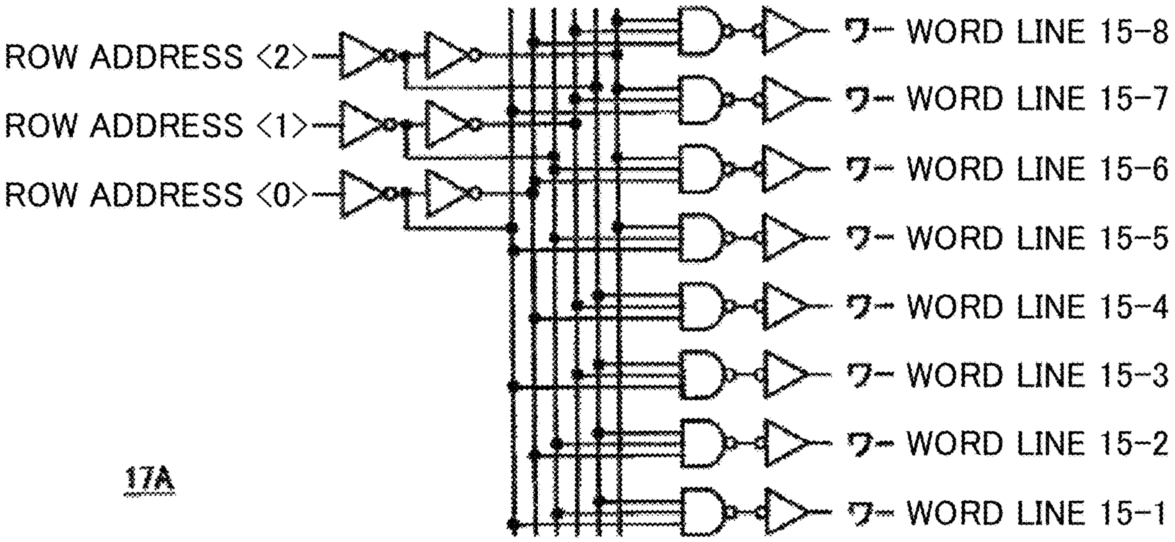
FIG. 8 is a circuit diagram illustrating a word line decoding circuit 17A of a DRAM chip according to a comparative example.

FIG. 8 is a circuit diagram illustrating a word line decoding circuit 17A of a DRAM chip according to a comparative example. FIG. 8 is a diagram illustrating a portion of the word line decoding circuit 17A with a function of simultaneously activating and deactivating two word lines. Comparing FIGS. 7 and 8, the word line decoding circuit 17 of FIG. 7 is configured to perform the logical AND operation between the least significant bit <0> of the row address and additional normal operating bits.

When "normal operation bit=1", the word line decoding circuit 17 of FIG. 7 is enabled to exclusively select from eight word lines 15-1 to 15-8 with a 3-bit row address, similar to the word line decoding circuit 17A of FIG. 8. However, when "normal operation bit=0" in the word line decoding circuit 17 of FIG. 7, the least significant bit <0> of the row address is ignored and two word lines are activated simultaneously.

Comparing FIGS. 7 and 8, simultaneous activation of the two word lines is readily achievable by ignoring one bit of the row address without significantly changing the circuit.

The word line decoding circuit 17 of FIG. 7 can readily be added to a word line decoding circuit of a typical DRAM as compared to a circuit that simultaneously activates three word lines (i.e., a number of word lines differing from a numeral expressed by the power of 2) as in FIG. 3. Further, an increase in chip size can be controlled because there is no need to have a memory cell area comprising a special decoding circuit.

In the second embodiment, a bit of the ignored row address is not limited to the least significant bit but may be any other bit.

In the second embodiment, multiple bits of the row address may also be ignored. In this case, two power word lines can be activated and deactivated simultaneously. Thus, instead of the command ACT2 of FIG. 5, an active command may be used to activate the sense amplifier 14 after activating the number of word lines expressed by a power of 2, from among the plurality of word lines 15; and instead of the command WLA2 of FIG. 5, an active command may be used not to automatically activate the sense amplifier 14 after activating the number of word lines expressed by a power of 2, from among the plurality of word lines 15

In the second embodiment, instead of the word line decoding circuit, the memory cell array control circuit may ignore at least one bit of the row address. The memory cell array control circuit or word line decoding circuit can simultaneously activate or deactivate a predetermined plurality of word lines by ignoring at least one bit of the row address.

Third Embodiment

Figure 9:
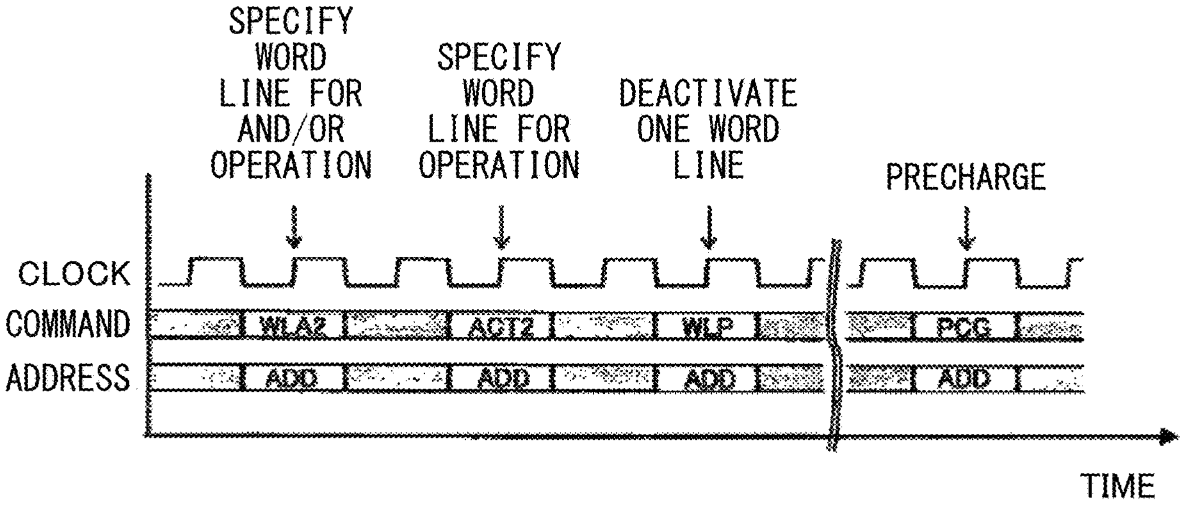
FIG. 9 is a timing chart illustrating operation of a column circuit of a memory cell array in a DRAM chip according to a third embodiment.

FIG. 9 is a timing chart illustrating operation of a column circuit of a memory cell array in a DRAM chip according to a third embodiment. The DRAM chip according to the third embodiment is configured similarly to the DRAM chip 1 according to the first embodiment.

Referring to FIGS. 4 and 9, according to the command ACT2, the two word lines 15-1 and 15-2 are activated to perform a second charge redistribution followed by deactivation of one of the two activated word lines 15-1 and 15-2 before activating the sense amplifier 14. Thereafter, operation is performed by activating the sense amplifier 14, and the result of the operation is stored in a memory cell 11 corresponding to a word line that has not been deactivated. By deactivating one of the two word lines 15-1 and 15-2 before activating the sense amplifier 14, capacitance imbalance between the bit line 13*a* and the inverse bit line 13*b* can be reduced.

The simultaneous activation of more than two word lines is similar to the operation illustrated in FIG. 9. The memory cell array control circuit 22 deactivates at least one of a plurality of word lines that are activated prior to activating the sense amplifier when the plurality of word lines are simultaneously activated. This reduces the capacitance imbalance between the bit line 13*a* and the inverse bit line 13*b* as described above.

Fourth Embodiment

Figure 10:
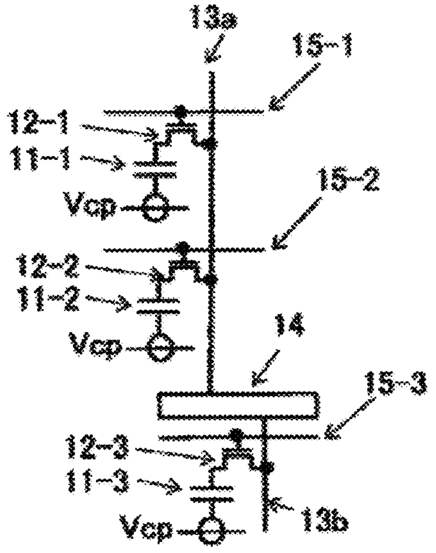
FIG. 10 is a circuit diagram illustrating one column circuit of a memory cell array in a DRAM chip according to fourth and fifth embodiments.

FIG. 10 is a circuit diagram illustrating one column circuit of a memory cell array in a DRAM chip according to fourth and fifth embodiments. The DRAM chip according to the fourth embodiment is configured similarly to the DRAM chip 1 according to the first embodiment. FIG. 10 illustrates a portion of a memory cell array associated with a plurality of memory cells arranged along a bit line 13*a* and an inverse bit line 13*b* connected to one common sense amplifier 14.

The memory cell array of FIG. 10 comprises three memory cells 11-1 to 11-3, three switching elements 12-1 to 12-3, a bit line 13*a*, an inverse bit line 13*b*, a sense amplifier 14, and three word lines 15-1 to 15-3.

The memory cell array of FIG. 10, like the memory cell array 10 of FIG. 4, can execute the logical AND operation and the logical OR operation on stored data. Referring to FIG. 10, at least three memory cells, comprising first to third memory cells 11-1 to 11-3, are arranged along a bit line 13*a* and an inverse bit line 13*b* connected to one common sense amplifier 14. The first and second memory cells 11-1 and 11-2 are connected to or disconnected from bit line 13*a* via first and second switching elements 12-1 and 12-2, according to the active or inactive state of the first and second word lines 15-1 and 15-2. The third memory cell 11-3 is connected to or disconnected from the inverse bit line 13*b* via a third switching element 12-3, according to the active or inactive state of the third word line 15-3. The first memory cell 11-1 stores a first bit value, the second memory cell 11-2 stores a second bit value, and the third memory cell 11-3 stores a third bit value. Any two of the first to third bit values are data subject to the logical AND operation or logical OR operation, and the remaining one of the first to third bit values specifies one of logical operations (the logical AND operation or the logical OR operation) to be performed.

The memory cell array control circuit 22 activates word lines 15-1 to 15-3, and then activates the sense amplifier 14 to perform the logical AND operation or logical OR operation specified by one of the first to third bit values on the remaining two of the first to third bit values.

As an example, suppose that the memory cell 11-3 stores the voltage "V" to specify the logical AND operation, and the memory cells 11-1 and 11-2 storing bit values subject to logical operation store the voltage "V". As in FIG. 3, it is supposed that where capacitance of each of bit lines 13*a* and 13*b* is represented by Cb and capacitance of each of the memory cells 11-1 to 11-3 is represented by Cs, Cb=2Cs is obtained. First, the memory cell array control circuit 22 activates the word line 15-1, and then deactivates word lines 15-1 after charge redistribution. The memory cell array control circuit 22 then activates word lines 15-2. The word line 15-3 may be activated at any time. When word lines 15-2 and 15-3 are activated to redistribute charge again, the differential voltage supplied to sense amplifier 14 is "V/9", which is large compared to the differential voltage supplied to the sense amplifier in the comparative example of FIG. 3. The sense amplifier 14 amplifies this voltage to obtain the results of the logical AND operation of memory cells 11-1 and 11-2.

The differential voltage of the sense amplifier 14 is greater than that in the comparative example of FIG. 3, but slightly smaller than that in a case of FIG. 4.

Figure 11:
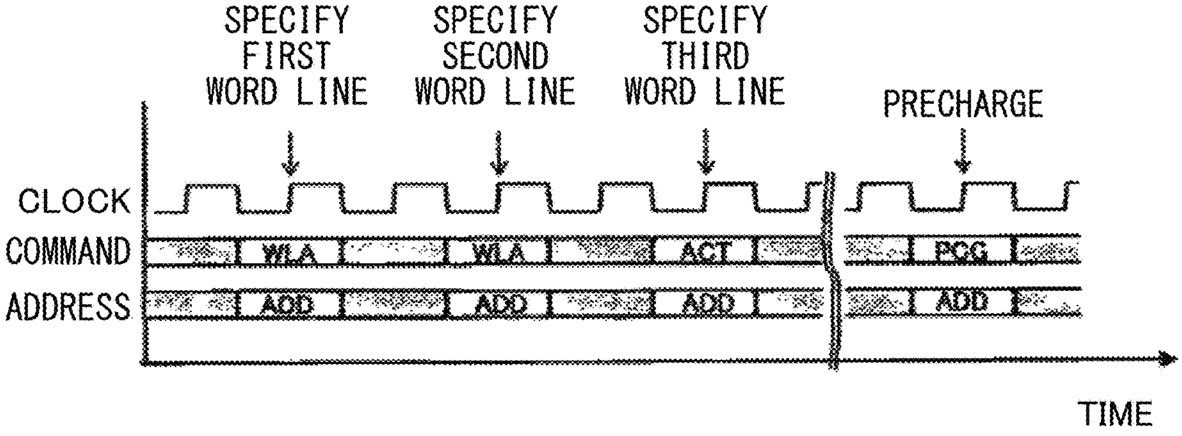
FIG. 11 is a timing chart illustrating operation of the column circuit of FIG. 10.

FIG. 11 is a timing chart illustrating operation of the column circuit of FIG. 10. In the operation of FIG. 11, the commands WLA, ACT, and PCG of FIG. 5 are used. First, the command WLA activates word lines 15-1 and 15-2. After the word line 15-3 is activated by the command ACT, the sense amplifier 14 is activated to perform the logical OR operation or logical AND operation. Finally, the command PCG completes the row access.

When the memory cell 11-3 performs the logical OR operation by storing the voltage "0", the memory cell 11-3 operates in the same way as when performing the logical AND operation.

Since one of the bit line 13*a* and the inverse bit line 13*b* is provided with only one word line, this portion may use the word line decoding circuit 17A of FIG. 8 with a simpler configuration, rather than the word line decoding circuit 17 of FIG. 7.

Thus, in the memory cell array of FIG. 10, the logical AND operation or logical OR operation is performed using two memory cells 11-1 and 11-2 connected to the same bit line 13*a* and one memory cell 11-3 connected to the inverse bit line 13*b* sharing the sense amplifier 14 with the bit line 13*a*. If a single memory cell is provided on the bit line 13*a* and two memory cells are provided on the inverse bit line 1*b*, the memory cell array operates in the same way as in the case of FIG. 10.

Fifth Embodiment

In the fourth embodiment, each of the three word lines may be activated, charge redistributed, and deactivated, and after charge redistribution of the third word line has been completed, the sense amplifier 14 may amplify the charge and store the calculation results in a memory cell corresponding to the word line. Thus, at some point in a column circuit, only one word line is activated, so that the word line decoding circuit 17A of FIG. 8 can be used. Even when the word line decoding circuit 17 of FIG. 7 is used, the normal operating bit "1" can remain unchanged. The previously activated word lines are deactivated simultaneously with activation of later activated word lines. If the previously activated word lines are not deactivated simultaneously with activation of later activated word lines, the previously activated word lines may be deactivated by the command WPL.

Thus, the memory cell array control circuit 22 deactivates at least one of a plurality of word lines that are activated prior to activating the sense amplifier 14 when the plurality of word lines are simultaneously activated. This reduces the capacitance imbalance between the bit line 13*a* and the inverse bit line 13*b* as in the third embodiment.

Sixth Embodiment

Figure 12:
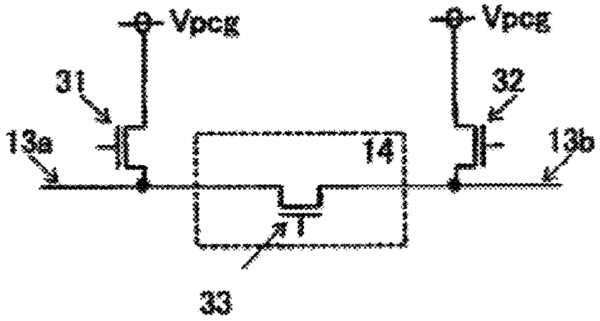
FIG. 12 is a circuit diagram illustrating a sense amplifier 14 of a DRAM chip according to sixth to eighth embodiments.

FIG. 12 is a circuit diagram illustrating a sense amplifier 14 of a DRAM chip according to a sixth to eighth embodiments. In the sixth embodiment, the sense amplifier 14 that is capable of executing a logical NOT operation (NOT) on stored data will be described. The DRAM chip according to the sixth embodiment is configured similarly to the DRAM chip 1 according to the first embodiment, except for the sense amplifier 14.

The sense amplifier 14 is connected to both bit line 13*a* and inverse bit line 13*b*. The bit line 13*a* is connected to a voltage source of a bit line precharge voltage Vpcg via a bit line precharge circuit 31. The inverse bit line 13*b* is connected to a voltage source of a bit line precharge voltage Vpcg via an inverse bit line precharge circuit 32. The Sense amplifier 14 comprises a bit line equalization circuit 33 connected between the bit line 13*a* and inverse bit line 13*b*. The bit line precharge circuit 31, inverse bit line precharge circuit 32, and bit line equalization circuit 33 are each switching elements, such as transistors. The bit line precharge circuit 31, inverse bit line precharge circuit 32, and bit line equalization circuit 33 operate under the control of the memory cell array control circuit 22 of FIG. 1.

The memory cell array control circuit 22 deactivates the sense amplifier 14 after the sense amplifier 14 generates a first bit value. The memory cell array control circuit 22 then independently precharges the bit line 13*a* and the inverse bit line 13*b* to vary potentials of the bit line 13*a* and the inverse bit line 13*b*. The memory cell array control circuit 22 then activates the sense amplifier 14 to generate a bit value obtained by inverting the first bit value.

Figure 13:
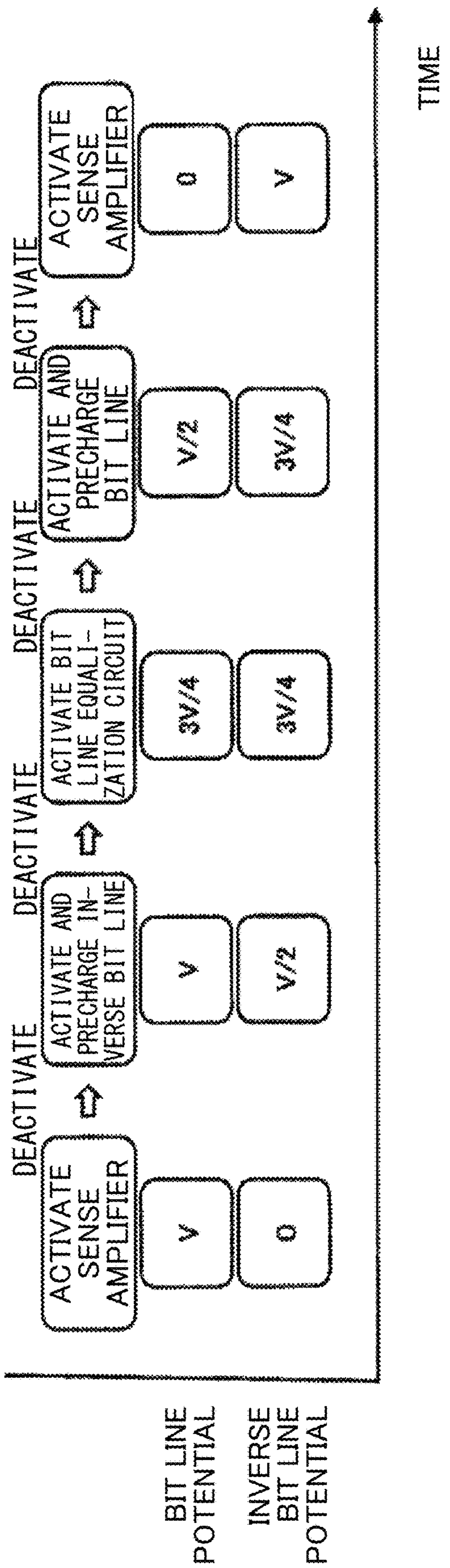
FIG. 13 is a sequence diagram illustrating operation of a sense amplifier 14 according to the sixth embodiment.

FIG. 13 is a sequence diagram illustrating operation of a sense amplifier 14 according to the sixth embodiment. Suppose that in a condition where the bit line precharge circuit 31, the inverse bit line precharge circuit 32, and the bit line equalization circuit 33 are deactivated, and the sense amplifier 14 is activated, the voltage "V" is set on the bit line 13*a* and the voltage "0" is set on the inverse bit line 13*b*. In addition, suppose that the word lines corresponding to the bit line 13*a* and the word line corresponding to the inverse bit line 13*b* are inactive. First, the sense amplifier 14 is deactivated. The inverse bit line precharge circuit 32 is then activated to precharge the inverse bit line 13*b* to a voltage "V/2", and thereafter the inverse bit line precharge circuit 32 is deactivated. After the bit line equalization circuit 33 is activated to redistribute charge, the bit line equalization circuit 33 is deactivated. The bit line precharge circuit 31 is then activated to precharge the bit line 13*a* to a voltage "V/2". Through this process, the bit line 13*a* becomes the precharge level of the voltage "V/2", the inverse bit line 13*b* becomes the voltage "3V/4", and the differential voltage is "V/4". Activation of the sense amplifier 14 amplifies this differential voltage such that the bit line 13*a* becomes the voltage "0" and the inverse bit line 13*b* becomes the voltage "V". This is a reversed state of the voltage set in the initial state. Thereafter, a word line is activated and the result of a NOT operation is stored in the memory cell 11 corresponding to the word line.

Each sense amplifier of the sense amplifier array 14A of FIG. 1 may be configured similar to the sense amplifier 14 of FIG. 12. Accordingly, the DRAM chip comprising the sense amplifier 14 of FIG. 12 can perform a NOT operation by row access unit.

Seventh Embodiment

Figure 14:
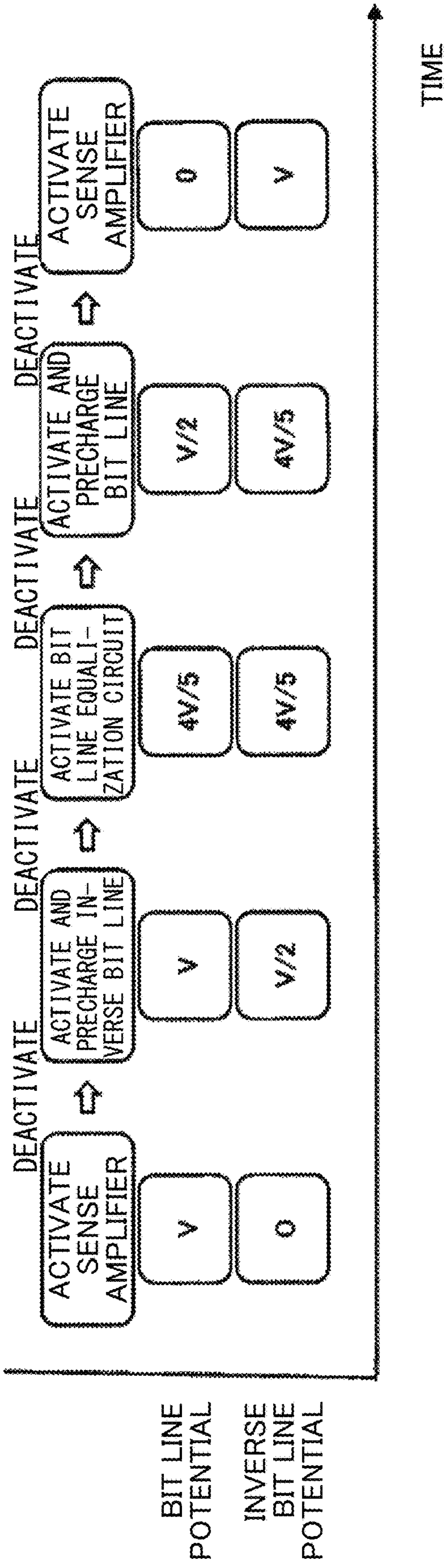
FIG. 14 is a sequence diagram illustrating operation of a sense amplifier 14 according to a seventh embodiment.

FIG. 14 is a sequence diagram illustrating operation of the sense amplifier 14 according to a seventh embodiment. In the seventh embodiment, the sense amplifier 14 of FIG. 12 will be described with respect to operation differing from that of the sense amplifier 14 according to the sixth embodiment.

Suppose that in a condition where the bit line precharge circuit 31, the inverse bit line precharge circuit 32, and the bit line equalization circuit 33 are deactivated, and the sense amplifier 14 is activated, the voltage "V" is set on the bit line 13*a* and the voltage "0" is set on the inverse bit line 13*b*. In addition, suppose that the word lines corresponding to the bit line 13*a* are activated. Furthermore, suppose that where the capacitance of each of bit lines 13*a* and 13*b* is represented by Cb and the capacitance of each of the memory cells 11 is represented by Cs, Cb=2Cs is obtained. First, the sense amplifier 14 is deactivated. The inverse bit line precharge circuit 32 is then activated to precharge the inverse bit line 13*b* to a voltage "V/2", and thereafter the inverse bit line precharge circuit 32 is deactivated. After the bit line equalization circuit 33 is activated to redistribute charge, the bit line equalization circuit 33 is deactivated. The bit line precharge circuit 31 is then activated to precharge the bit line 13*a* to a voltage "V/2". Through this process, the bit line 13*a* becomes the precharge level of the voltage "V/2", the inverse bit line 13*b* becomes the voltage "4V/5", and the differential voltage is "3V/10". Activation of the sense amplifier 14 amplifies this differential voltage such that the bit line 13*a* becomes the voltage "0" and the inverse bit line 13*b* becomes the voltage "V". This is a reversed state of the voltage set in the initial state. At the same time as activating the sense amplifier 14, the result of the operation is then stored in a memory cell 11 corresponding to the word line 15 being activated.

According to the seventh embodiment, the differential voltage of the sense amplifier 14 when the NOT operation is performed is larger compared to the case of the sixth embodiment.

According to the seventh embodiment, as in the sense amplifier 14 according to the sixth embodiment, a NOT operation can be performed in the units of row access.

Eighth Embodiment

Figure 15:
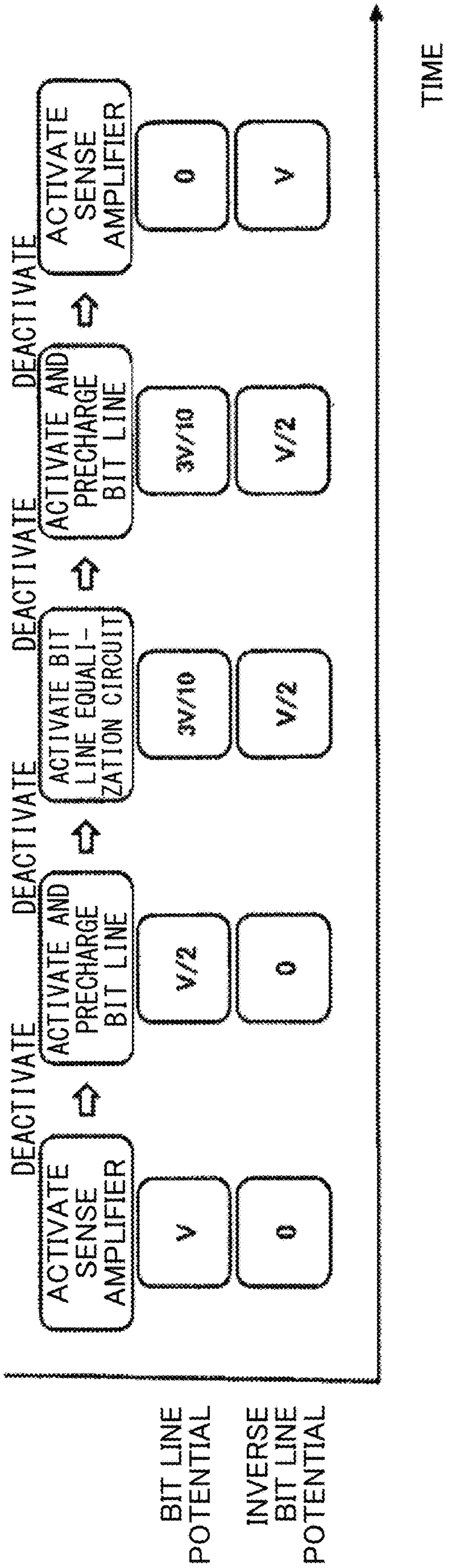
FIG. 15 is a sequence diagram illustrating operation of a sense amplifier 14 according to an eighth embodiment.

FIG. 15 is a sequence diagram illustrating operation of a sense amplifier 14 according to an eighth embodiment. In the eighth embodiment, the sense amplifier 14 of FIG. 12 will be described with respect to operation differing from that of the sense amplifier 14 according to the sixth and the seventh embodiments.

Suppose that in a condition where the bit line precharge circuit 31, the inverse bit line precharge circuit 32, and the bit line equalization circuit 33 are deactivated, and the sense amplifier 14 is activated, the voltage "V" is set on the bit line 13*a* and the voltage "0" is set on the inverse bit line 13*b*. In addition, suppose that the word lines corresponding to the bit line 13*a* are activated. First, the sense amplifier 14 is deactivated. The bit line precharge circuit 31 is then activated to precharge the bit line 13*a* to voltage "V/2" and then deactivate the bit line precharge circuit 31. Then after the bit line equalization circuit 33 is activated to redistribute the charge, the bit line equalization circuit 33 is deactivated. Thereafter, the inverse bit line precharge circuit 32 is activated to precharge the inverse bit line 13*b* to the voltage "V/2". Through this process, the inverse bit line 13*b* becomes a precharge level of the voltage "V/2", the bit line 13*a* becomes a voltage "3V/10", and the differential voltage is "2V/10". Activation of the sense amplifier 14 amplifies this differential voltage such that the bit line 13*a* becomes the voltage "0" and the inverse bit line 13*b* becomes the voltage "V". This is a reversed state of the voltage set in the initial state. At the same time as activating the sense amplifier 14, the result of the operation is then stored in a memory cell 11 corresponding to the word line 15 being activated.

According the seventh embodiment, the differential voltage of the sense amplifier 14 when the NOT operation is performed is reduced compared to the case of the sixth embodiment.

According to the eighth embodiment, a NOT operation can be performed by row access unit, as in the sense amplifier 14 according to the sixth and seventh embodiments.

Ninth Embodiment

Figures 16, 17, 18:
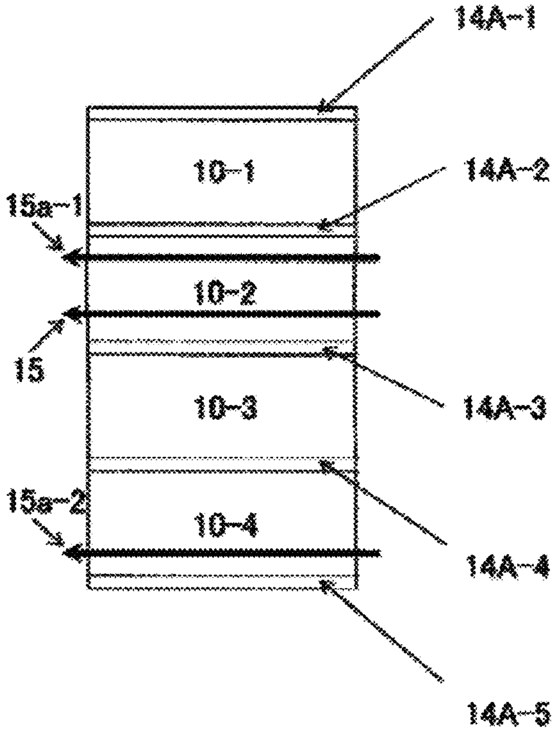
FIG. 16 is a schematic diagram illustrating a configuration of a plurality of memory cell arrays 10-1 to 10-4 of a DRAM chip according to ninth and tenth embodiments.
FIG. 17 is a table illustrating a portion of the commands of LPDDR4.
FIG. 18 is a table illustrating commands issued for a DRAM chip according to an eleventh embodiment.

FIG. 16 is a schematic diagram illustrating a configuration of a plurality of memory cell arrays 10-1 to 10-4 of a DRAM chip according to ninth and tenth embodiments. The DRAM chip may include a plurality of memory cell arrays, each memory cell array may include a redundancy circuit comprising at least one spare word line, a plurality of spare memory cells and a plurality of spare switching elements arranged along the word line.

The DRAM chip of FIG. 16 comprises a plurality of memory cell arrays 10-1 to 10-4 and a plurality of sense amplifier rows 14A-1 to 14A-5 each having a plurality of sense amplifiers 14 in array. The memory cell arrays 10-1 to 10-4 are arranged such that one of the sense amplifier rows 14A-1 to 14A-5 is located between any two vertically adjacent memory cell arrays. The DRAM chip of FIG. 16 comprises a redundancy circuit, which is disposed at least one in each of memory cell arrays 10-1 to 10-4, and comprises at least one spare word line of a corresponding one of memory cell arrays 10-1 to 10-4, and a plurality of spare memory cells and a plurality of spare switching elements arranged along the word line. The DRAM chip according to the ninth embodiment is configured similarly to the DRAM chip according to the first embodiment, except that the DRAM chip according to the ninth embodiment comprises a plurality of memory cell arrays 10-1 to 10-4 and a plurality of sense amplifier rows 14A-1 to 14A-5.

Note that a circuit portion of a memory cell array, which comprises a word line, a plurality of memory cells and a plurality of switching elements arranged along the word line, is referred to as a "row circuit". In the event of a failure in a word line, or a failure in memory cells or switching elements arranged along the word line, the failure may be repaired by replacing such a row circuit containing a failure with a redundancy circuit. In FIG. 16, it is supposed that a row circuit comprising a word line 15*a*-1 or a row circuit comprising a word line 15*a*-2 is a redundancy circuit. In the event of a failure in a row circuit comprising a word line 15 of the memory cell array 10-2, the row circuit may be replaced with a redundancy circuit comprising a word line 15*a*-1 in the same memory cell array 10-2, or may be replaced with a redundancy circuit comprising a word line 15*a*-2 of another memory cell array 10-4.

The memory cell array control circuit 22 may operate one memory cell array as an operational circuit when a failure in this one memory cell array, which is one of the plurality of memory cell arrays 10-1 to 10-4, is repaired by a redundancy circuit of the memory cell array. If a row circuit having a failure and a redundancy circuit are included in the same memory cell array, memory cells of the redundancy circuit are each connected to the same bit line and sense amplifier as the ones to which the row circuit comprising the failure is connected. Accordingly, even if the row circuit replaced with the redundancy circuit, the memory cell array can operate as an arithmetic circuit as described in each of the above-described embodiments.

A redundancy circuit may be used instead of or in addition to the redundancy circuit along the word line as described above, comprising at least one spare bit line or column selection line of each of memory cell arrays 10-1 to 10-4, and a plurality of spare memory cells and a plurality of spare switching elements arranged along the bit line or column selection line.

Tenth Embodiment

As described above, in the DRAM chip of FIG. 16, in the event of a failure in a row circuit comprising word line 15 of memory cell array 10-2, the row circuit may be replaced with a redundancy circuit comprising word line 15*a*-2 of another memory cell array 10-4.

The memory cell array control circuit 22 stops operating one memory cell array as an operational circuit when a failure in this memory cell array, which is one of the plurality of memory cell arrays 10-1 to 10-4, is repaired by a redundancy circuit in another memory cell array. If a row circuit having a failure and a redundancy circuit are included in different memory cell arrays, respectively, memory cells of the redundancy circuit are each connected to a bit line and sense amplifier differing from the ones to which the row circuit comprising the failure is connected. Accordingly, if the row circuit comprising a word line 15 of memory cell array 10-2 is replaced with a redundancy circuit comprising a word line 15*a*-2 of memory cell array 10-4, the memory cell array 10-2 cannot operate as an arithmetic circuit as described in each of the above embodiments; however, data can be stored according to the specifications of JEDEC DRAM products.

If one of the memory cell arrays 10-1 to 10-4 has a row circuit containing a failure, but there is no unused redundancy circuit in any of the memory cell arrays 10-1 to 10-4, the memory cell array control circuit 22 may determine that the memory cell array containing the failure is defective.

According to the DRAM chip of the ninth and tenth embodiments, a row circuit comprising a failure may be found in a manufacturing process of the DRAM chip, and the row circuit comprising a failure may be replaced by a redundancy circuit in the same memory cell array as the row circuit comprising a failure or by a redundancy circuit in a different memory cell array. Thus, the yield of the DRAM chip that performs operation on the stored data can be improved.

Eleventh Embodiment

Eleventh to thirteenth embodiments illustrate examples of incorporation of commands used to perform operation on data according to each of the embodiments of the present invention using active commands of Low-Power DR4 SDRAM (LPDR4), which are standardized in JEDEC.

FIG. 17 is a table illustrating a portion of the commands of LPDDR4. FIG. 18 is a table illustrating commands issued for a DRAM chip according to the eleventh embodiment. To represent the commands ACT, ACT2, WLA, and WLA2 of FIG. 5, two bits S0 and S1 are used, and these bits S0 and S1 are incorporated into the commands of FIG. 17 as follows. Bit S0 is assigned to bit CA5 of chip select line CS=H of command ACT-1, and bit S1 is assigned to bit CA3 of chip select line CS=L of command ACT-1. For example, S<1:0>=00, 01, 10, and 11 are assigned to the commands ACT, ACT2, WLA, and WLA2 of FIG. 5, respectively.

According to the commands of FIG. 18, the commands can be used to perform operation on data in accordance with each of the embodiments of the present invention without adding new commands to LPDDR4.

According to the commands illustrated in FIG. 18, since bit RA15 of FIG. 17 cannot be used, data of 12 gigabits or more cannot be stored.

Twelfth Embodiment

Figures 19, 20, 21:
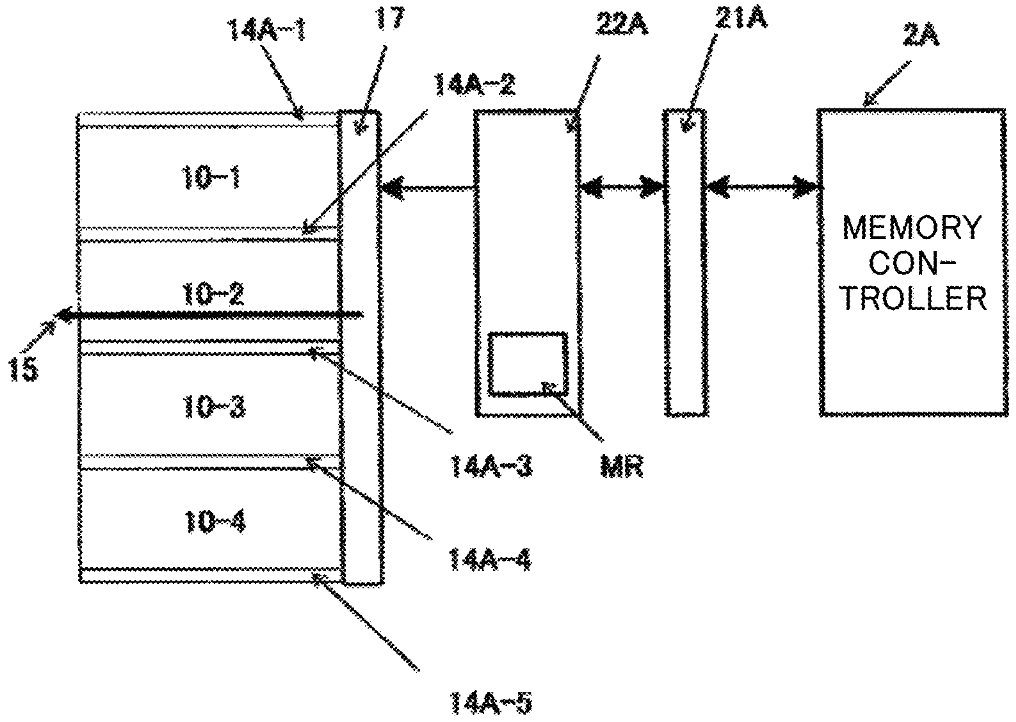
FIG. 19 is a table illustrating commands issued for a DRAM chip according to a twelfth embodiment.
FIG. 20 is a table illustrating commands issued for a DRAM chip according to a thirteenth embodiment.
FIG. 21 is a schematic diagram illustrating a configuration of a plurality of memory cell arrays 10-1 to 10-4 of respective DRAM chips according to a fourteenth embodiment.

FIG. 19 is a table illustrating commands issued for a DRAM chip according to a twelfth embodiment. FIG. 19 illustrates another example of incorporating commands used to perform operation on data in accordance with each of the embodiments of the present invention into the commands of LPDDR4. According to FIG. 19, a command defined as RFU (Reserved for Future Use) in the JEDEC standard is used as an active select command ASEL. Bits S0 and S1 described in the eleventh embodiment are allocated to bits CA0 and CA1 of the chip select line CS=L of this command ASEL.

Of the sequences of the three commands ASEL, ACT-1, and ACT-2, one of the commands ACT, ACT2, WLA, and WLA2 can be specified by the command ASEL, followed by the commands ACT-1 and ACT-2 to specify a bank address and a row address.

Thirteenth Embodiment

FIG. 20 is a table illustrating commands issued for a DRAM chip according to a thirteenth embodiment. FIG. 20 illustrates another example of incorporating commands used to perform operation on data in accordance with each of the embodiments of the present invention into the commands of LPDDR4. According to FIG. 20, three commands defined as RFU in the JEDEC standard are used as active select commands ASEL-1 to ASEL-3. Bits S0 and S1 described in the eleventh embodiment are allocated to bits CA0 and CA1 of the chip select line CS=L of the command ASEL-3. Of the sequences of the three commands ASEL-1 to ASEL-3, a bank address and a row address can be specified by the commands ASEL-1 to ASEL-3, and one of the commands ACT, ACT2, WLA, and WLA2 can be specified by the command ASEL-3.

Fourteenth Embodiment

In the event of a DRAM chip comprising a plurality of memory cell arrays as illustrated in FIG. 16, whether the plurality of memory cells are on the same bit line or on the inverse bit line sharing the sense amplifier needs to be recognized in order to perform operation by row access unit in accordance with each of the embodiments of the present invention. That is, the memory controller must be aware of what row address value identifies boundaries between memory cell arrays.

FIG. 21 is a schematic diagram illustrating a configuration of a plurality of memory cell arrays 10-1 to 10-4 of a DRAM chip according to a fourteenth embodiment. The DRAM chip of FIG. 20 comprises a plurality of memory cell arrays 10-1 to 10-4 and a plurality of sense amplifier rows 14A-1 to 14A-5 each having a plurality of sense amplifiers 14 in array. The memory cell arrays 10-1 to 10-4 are arranged such that one of the sense amplifier rows 14A-1 to 14A-5 is located between any two vertically adjacent memory cell arrays. A memory cell array control circuit 22A comprises a mode register MR readable from a memory controller 2A external to the DRAM chip via a command input circuit 21A. The mode register MR comprises a plurality of bits indicative of a position of a boundary between memory cell arrays, i.e., a plurality of bits storing a row address specifying a position of one sense amplifier array between any two vertically adjacent memory cells of the plurality of memory cell arrays 10-1 to 10-4. The DRAM chip according to the fourteenth embodiment is configured similarly to the DRAM chip 1 according to the first embodiment, except that the DRAM chip comprises a plurality of memory cell arrays 10-1 to 10-4 and a plurality of sense amplifiers rows 14A-1 to 14A-5, the memory cell array control circuit 22A comprises a mode register MR, and the memory cell array control circuit 22A is capable of bidirectionally communicating with the memory controller 2A via the command input circuit 21A.

FIG. 22A is a table illustrating a first portion of a mode register used by a DRAM chip according to the fourteenth embodiment. FIG. 22B is a table illustrating a second portion of the mode register used by the DRAM chip according to the fourteenth embodiment. FIGS. 22A and 22B each illustrate an example of incorporating a plurality of bits into the mode register of LPDR4 used to allow the position of the boundary between memory cell arrays to be read from the memory controller 2A in accordance with the fourteenth embodiment. The memory cell array control circuit 22A writes a row address of the boundary between memory cell arrays to mode registers MR26 and MR27, which are defined as RFUs in the JEDEC standard. For example, if there are 512 word lines in a block of one memory cell array, $512=2^9$; thus, "0000010" is written to operand OP [7:0] of mode register MR26 and "00000000" is written to operand OP [7:0] of mode register MR27. The memory controller 2A reads contents of the mode registers MR26 and MR27 in read operation of the mode registers and recognizes that the boundary of the memory cell array is a row address RA <9>.

Thus, even if the DRAM chip comprises a plurality of memory cell arrays, the memory controller 2A can recognize boundaries between memory cell arrays and perform operations by row access unit in accordance with each of the embodiments of the present invention.

Fifteenth Embodiment

A fifteenth embodiment describes an process for performing an operation in accordance with each of the embodiments of the present invention to rapidly search for data in a bitmap index.

FIG. 23 is a diagram illustrating examples of records stored in a memory cell array of a DRAM chip according to a fifteenth embodiment. A record containing a plurality of bit values representing at least one attribute is stored in a plurality of memory cells arranged along a bit line, for each of the bit lines.

In FIG. 23, each of the fields identified by a record name and a key item indicates a bit value stored in one memory cell. Record names "A" to "J" indicate, for example, full names. For example, 10-bit key items "0" to "9" indicate attributes, such as sex, age, etc. of a person identified by the record name. The record names are arranged in a word line direction and the key items are arranged in a bit line direction.

Figure 24:
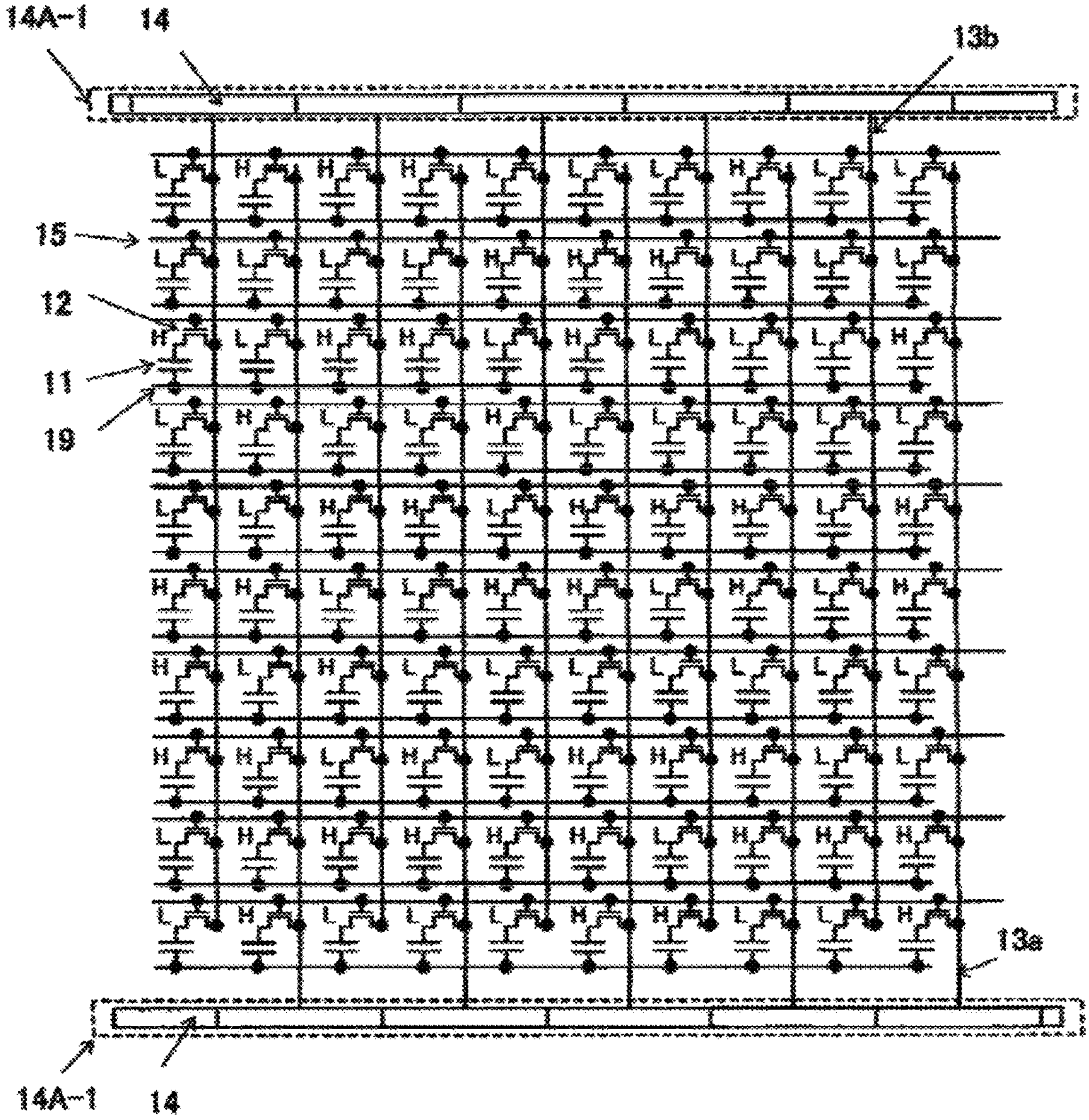
FIG. 24 is a circuit diagram illustrating a configuration of a memory cell array of a DRAM chip according to the fifteenth embodiment.

FIG. 24 is a circuit diagram illustrating a configuration of a memory cell array of a DRAM chip according to the fifteenth embodiment. FIG. 24 illustrates physical arrangement of the data illustrated in FIG. 23 on a memory cell array. When the voltage of memory cells 11 arranged along a bit line 13*a* is "H", a bit value "1" is stored in the memory cells 11, and when the voltage is "L", a bit value "0" is stored in the memory cells 11. Meanwhile, when the voltage of memory cells 11 arranged along an inverse bit line 13*b* is "H", a bit value "0" is stored in the memory cells 11, and when the voltage is "L", a bit value "1" is stored in the memory cells 11.

When a search key X comprising a plurality of bit values is input, the memory cell array control circuit 22 performs the logical AND operation on the bit values stored in the memory cells corresponding to the positions of the bit values "1" of the search key, and also performs the logical OR operation on the bit values stored in the memory cells corresponding to the positions of the bit values "0" of the search key. In this manner, the memory cell array control circuit 22 searches for a record that matches the search key among from records stored in the memory cell array 10.

FIG. 25 is a diagram illustrating a record search with respect to records stored in the memory cell array of FIG. 23. In this case, for example, a search is conducted to determine whether there is a record having key items “0” to “9” that match respective bits of the search key X “1010101101” in FIG. 25. In this case, by activating and deactivating the word lines corresponding to the key items “0”, “2”, “4”, “6”, “7”, and “9” of respective records, the logical AND operation is performed on the bit values stored in the memory cells corresponding to these key items of the respective records. In addition, by activating and deactivating the word lines corresponding to the key items “1”, “3”, “5”, “6”, “7”, and “8” of the respective records, the logical OR operation is performed on the bit values stored in the memory cells corresponding to these key items of the respective records.

Referring to FIG. 25, the logical AND operation is performed on bit values stored in the memory cells along the word lines corresponding to the key items “0” and “2”, and results are stored in memory cells corresponding to the key item “0”. Subsequently, the logical AND operation is performed on the bit values stored in the memory cells corresponding to the key items “4” and “6”, and results are stored in the memory cells corresponding to the key item “4”. Then, the logical AND operation is performed on the bit values stored in the memory cells corresponding to the key items “7” and “9”, and results are stored in the memory cells corresponding to the key item “7”. Further, the logical AND operation is performed on the bit values stored in the memory cells corresponding to the key items “0” and “4”, and results are stored in the memory cells corresponding to the key item “0”. Finally, the logical AND operation is performed on the bit values stored in the memory cells corresponding to the key items “0” and “7”, and results are stored in the memory cells corresponding to the key item “0”. Accordingly, the results obtained by performing the logical AND operation on the bit values stored in all the memory cells corresponding to the key items “0”, “2”, “4”, “6”, “7”, and “9” are stored in the memory cells corresponding to the key item “0”. If these bit values stored corresponding to the key item “0” are “1”, the resulting bit values obtained by performing the logical AND operation on the bit values stored in all the memory cells corresponding to the positions of the bit values “1” of the search key are “1”.

Subsequently, results obtained by performing the logical OR operation on the bit values stored in all the memory cells corresponding to the key items “1”, “3”, “5”, and “8” are stored in the memory cells along the word line corresponding to the key item “1”. If these bit values stored corresponding to the key item “1” are “0”, the resulting bit values obtained by performing the logical AND operation on the bit values stored in all the memory cells corresponding to positions of the bit values “0” of the search key are “0”.

Thus, a record that completely matches the search key X completely is a record having the resulting bit values of performing the logical AND operation on the bit values stored in all the memory cells corresponding to the positions of the bit values “1” of the search key being “1”, and the resulting bit values of performing the logical AND operation on the bit values stored in all the memory cells corresponding to the positions of the bit values “0” of the search key being “0”.

FIG. 26 is a diagram illustrating record search and sort with respect to records stored in the memory cell array of FIG. 23, FIG. 26 illustrates a table obtained by storing bit values of a search key and bit values of the key items of respective records in accordance with a bit value “1” or “0” of the key items of the search key X. Of the search key and a record that matches the search key, it is obvious that the bit values obtained by performing the logical AND operation on the bit values stored in all the memory cells corresponding to the positions of the bit values “1” of the search key are “1”, and that the bit values obtained by performing the logical AND operation on the bit values stored in all the memory cells corresponding to the positions of the bit values “0” of the search key are “0”. In this case, of the records “E” and “I”, the bit values obtained by performing the logical AND operation on the bit values stored in all the memory cells corresponding to the positions of the bit values “1” of the search key are “I”. In addition, of the record “E”, bit values obtained by performing the logical AND operation on the bit values stored in all the memory cells corresponding to the positions of the bit values “0” of the search key are “0”. Accordingly, it is clear that the record “E” matches the search key X.

As described above, a record that matches a search key can be identified by executing the logical AND operation or logical OR operation by row access unit according to the search key X, and finally reading bit values of two word lines corresponding to the memory cells storing all the results of the logical AND operation or the logical OR operation. Further, in this case, a NOT operation is not required, and hence, it is possible to determine a match and mismatch between the search key and a record only by performing the logical AND operation and logical OR operation by row access unit. In addition, not all the key items of a record are subject to the logical AND or logical OR operation; only some of desired key items of a record may be subject to the logical AND or logical OR operation to determine a match and mismatch with respect to the desired key items.

Sixteenth Embodiment

A sixteenth embodiment describes another process for performing an operation in accordance with each of the embodiments of the present invention to rapidly search for data in a bitmap index.

When a search key comprising a plurality of bit values is input, the memory cell array control circuit 22 performs an exclusive logical OR (XOR) or logical exclusive NOR (XNOR) operation between the search key and records stored in the memory cell array, thereby obtaining a record that matches the search key from the records stored in the memory cell array.

FIG. 27 is a diagram illustrating a search of records stored in a memory cell array of a DRAM chip according to the sixteenth embodiment. In FIG. 27, bit values of the records “A” to “J” corresponding to key items “0” to “9” and the search key X are the same as those of FIG. 23. In this embodiment, reverse data “/0” to “/9” of the key items “0” to “9” are stored in the same memory cell array in advance. In order to store the reverse data “/0” to “/9” of the key items “0” to “9”, the reverse data “/0” to “/9” may be generated and written by the processor 3 or the memory controller 2 simultaneously with writing positive data of the key items “0” to “9” from the processor 3 and the memory controller 2 outside the DRAM chip. Alternatively, the reverse data “/0” to “/9” may be generated from the positive data of the key items “0” to “9” on the memory cell array using the NOT operation of the eighth embodiment. A word line corresponding to each key item is activated to perform an exclusive logical OR (XOR) operation with the bits of the search key. The logical XOR operation with bit values “A” and “B” can be performed by OR [AND [A, NOT[B]], AND [NOT[A], B]] using the logical AND operation, logical OR operation, and logical NOT operation. Accordingly, the logical AND operation, the logical OR operation, and logical NOT operation by row access unit ultimately yield the results of the logical XOR operation by row access unit. If a bit value of a key item matches a bit value of the search key, the bit value of the result of the logical XOR operation is "0", and if the bit values do not match, the bit value of the result of the logical XOR operation is "1".

FIG. 28 is a diagram illustrating results of the logical XOR operation on records stored in the memory cell array and a search key in FIG. 27. FIG. 28 illustrates results of the logical XOR operation on bit values of the search key and the bit values of each record with respect to respective key items. Subsequently, when the logical OR operation on the bit values stored in the memory cells corresponding to all the key items is performed in the units of row access, the resulting bit values being "0" are obtained only for the records that completely match the search key. Since each of the resulting bit values is stored in one memory cell, if the corresponding word line is activated and the bit value of the memory cell is read out, information of the complete match or mismatch can be obtained externally.

Instead of the XOR, the same effect can be obtained by computing the resulting bit value to be "1" only for records that completely match the search key using the XNOR operation.

Seventeenth Embodiment

A seventeenth embodiment describes process for performing an operation according to each of the embodiments of the present invention to search for data in the bitmap index to determine a matching level between the search key and each record.

FIG. 29 is a diagram illustrating results of determining matching and mismatching between records stored in a memory cell array of a DRAM chip according to a seventeenth embodiment and a search key. FIG. 29 is an example of results obtained by determining a match and a mismatch with respect to a search key by row access unit. In FIG. 29, the bit value "1" indicates a matched key item, and the bit value "0" indicates a mismatched key item, as determined results. That is, in this example, there are no records comprising all bit values being "1", i.e., there are no records that exactly match the search key. In the seventeenth embodiment, a process of finding a record with a higher matching level with respect to the search key will be described.

When a search key comprising a plurality of bit values is input, the memory cell array control circuit 22 searches for a record that matches the search key, from among first records stored in the memory cell array. The memory cell array control circuit 22 generates, for each bit line, a second record comprising a plurality of bit values indicating matching or mismatching between bits of each first record and bits of the search key. The memory cell array control circuit 22 sorts bits of the second records to determine a matching level between the first records and the search key.

FIG. 30 is a diagram illustrating an initial state of a process for determining a matching level between records stored in a memory cell array of a DRAM chip according to the seventeenth embodiment and a search key. The bit values of respective memory cells in rows "0" to "9" in FIG. 30 are the same as the bit values of the respective memory cells corresponding to the key items "0" to "9" in FIG. 29. The bit value "1" is input into all the memory cells in row "10". The bit value "0" is input into all the memory cells in row "11" to "20". Note that, for the row "0", the majority function is performed on the bit values of respective rows "0", "10", and "11", and results are stored in the row "11". Next, for the row "1", the majority function is performed on the bit values of respective rows "1", "11", and "12", and results are stored in the row "12", and the majority function is performed on the bit values of respective rows "1", "10", and "11", and results are stored in row "11". In this manner, operation is sequentially performed with respect to the row "N" (0≤N≤9); the majority function is performed on the bit values of respective rows "N", "N+10", and "N+11", and results are stored in the row "N+11"; then the majority function is performed on the bit values of respective rows "N", "N+9", and "N+10", and results are stored in the row "N+10"; and finally the majority function is performed on the bit values of respective rows "N", "10", and "11", and results are stored in the row "11", thereby completing the operation for the row "N".

FIG. 31 is a diagram illustrating the results of determining a matching level between the records stored in the memory cell array of the DRAM chip according to the seventeenth embodiment and the search key. FIG. 31 illustrates the results of sequentially executing the operation described with reference to FIG. 30 in the order from the rows "0" to "9". In the rows 11 to 20, the bit values "1" in the rows "0" to "9" are sorted so that as many of the values "1" are placed in the order from the rows of smaller numbers as possible. Subsequently, when the bit values in the memory cells of respective records are read in the order from the rows "20" to "11", the record of which the bit value "1" is first read has the highest matching level with respect to the search key.

In FIG. 29, when a matching key item is indicated by the bit value "0" and a mismatching key item is indicated by the bit value "1", a matching level between the search key and each record can be determined in the same manner.

Figure 32:
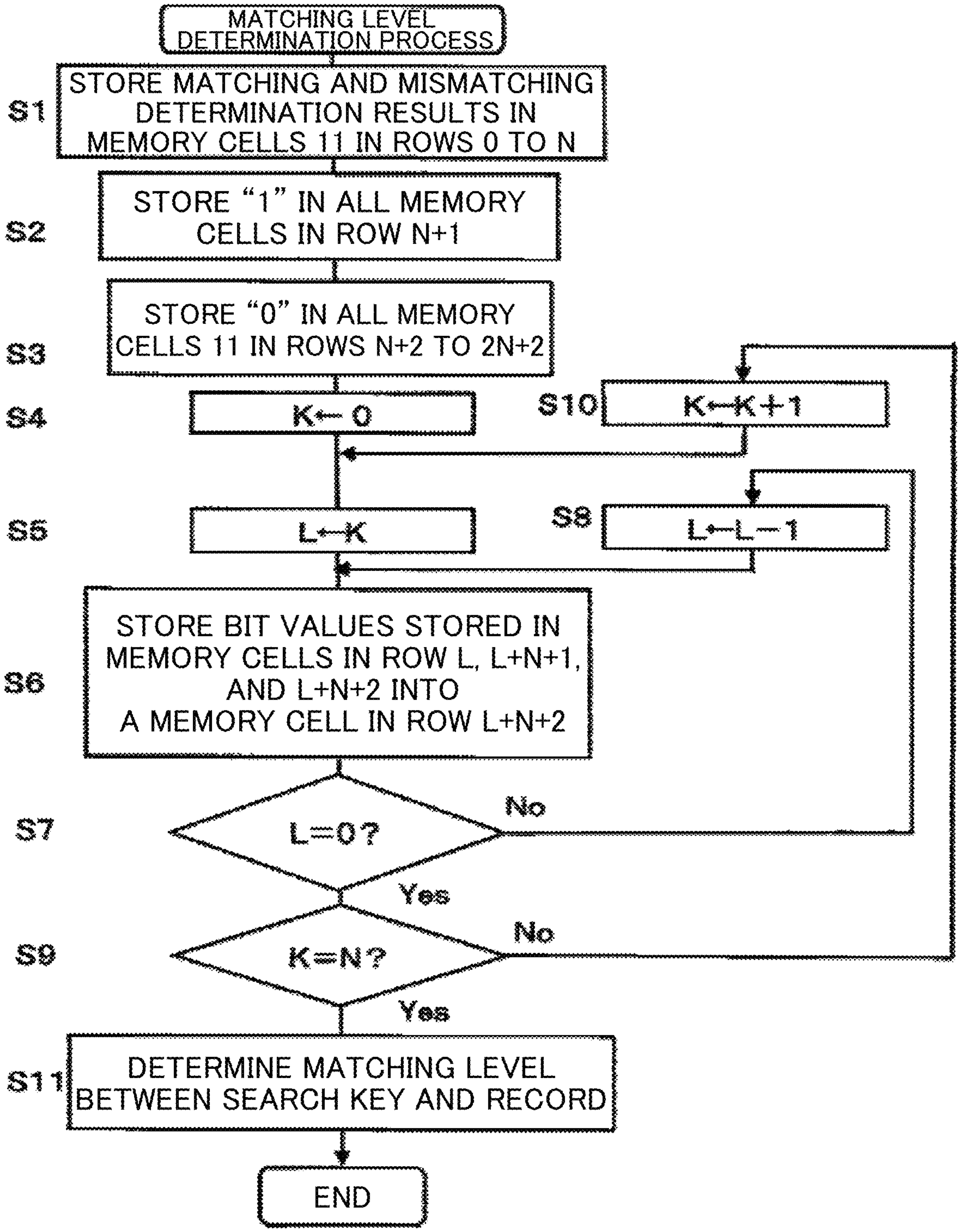
FIG. 32 is a flowchart illustrating a process for determining matching and mismatching between each record stored in a memory cell array of the DRAM chip according to the seventeenth embodiment and the search key.

FIG. 32 is a flowchart illustrating a process for determining matching and mismatching between each record stored in a memory cell array of a DRAM chip according to the seventeenth embodiment and a search key.

In step S1, the memory cell array control circuit 22 stores matching and mismatching determination results in the memory cells 11 in rows 0 to N. In step S2, the memory cell array control circuit 22 stores "1" in all the memory cells 11 in row N+1. In step S3, the memory cell array control circuit 22 stores "0" in all the memory cells 11 in rows N+2 to 2N+2. In step S4, the memory cell array control circuit 22 initializes a variable K to 0. In step S5, the memory cell array control circuit 22 sets a value of the variable K to a variable L. In step S6, the memory cell array control circuit 22 stores in a memory cell in row L+N+2, a value obtained by performing a majority function on the bit values stored in the memory cells in the rows L, L+N+1, and L+N+2. In step S7, the memory cell array control circuit 22 determines whether the variable L is equal to 0, proceeds to step S9 when the variable L being 0 is YES, and proceeds to step S8 when the variable L being 0 is NO. In step S8, the memory cell array control circuit 22 decrements the variable L by 1 and returns to step S6. In step S9, the memory cell array control circuit 22 determines whether the variable K is equal to the number N of the key items, proceeds to step S11 when the variable L being N is YES, and proceeds to step S10 when the variable L being N is NO. In step S10, the memory cell array control circuit 22 increments the variable K by 1 and returns to step S5. In step S11, the memory cell array control circuit 22 determines the matching level between the search key and the record, and then ends the process.

The memory cell array control circuit 22 may determine a record having the highest matching level and informs the memory controller 2 and processor 3 of the determination result.

A case where N=9 is set in the process illustrated in FIG. 32 corresponds to the example illustrated in FIG. 30.

INDUSTRIAL APPLICABILITY

The present invention is useful in semiconductor memory devices in systems that require a large amount of data to be computationally processed with less power, for example, matching performed with bit-mapped data.

The invention claimed is:

1. A semiconductor memory device, comprising:

at least one memory cell array, comprising a plurality of memory cells arranged along a plurality of word lines and a plurality of bit lines orthogonal to one another, a plurality of switching elements, for connecting or disconnecting each of the memory cells arranged along a corresponding word line of the word lines to or from a corresponding bit line of the bit lines in accordance with an active or inactive state of the corresponding word line;

a plurality of sense amplifiers, connected to the plurality of bit lines, respectively; and a control circuit, for activating or deactivating the word lines and the sense amplifiers, wherein at least four memory cells comprising first to fourth memory cells among the plurality of memory cells are arranged along a corresponding bit line of the bit lines, wherein the first to fourth memory cells are each connected to or disconnected from one bit line by first to fourth switching elements among the plurality of switching elements, in accordance with an active or inactive state of first to fourth word lines among the plurality of word lines, wherein the first memory cell stores a first bit value, the second memory cell stores a second bit value, and the third and fourth memory cells each store a third bit value, and wherein the control circuit activates the third and fourth word lines, then deactivates the third and fourth word lines, subsequently activates the first and second word lines, and then activates the corresponding sense amplifiers so that a logical AND operation or a logical OR operation specified by the third bit value is performed on the first and second bit values.

2. A semiconductor memory device, comprising:

at least one memory cell array, comprising a plurality of memory cells arranged along a plurality of word lines and a plurality of bit lines orthogonal to one another, the plurality of bit lines comprising a plurality of first bit lines and a plurality of second bit lines;

a plurality of switching elements, for connecting or disconnecting each of the memory cells arranged along a corresponding word line of the word lines to or from a corresponding first bit line of the first bit lines or a corresponding second bit line of the second bit lines, arranged along the corresponding word line of the word lines, in accordance with an activated or inactive state of the corresponding word line of the word lines;

a plurality of sense amplifiers, each connected to one of the plurality of first bit lines and one of the plurality of second bit lines; and a control circuit, for activating or deactivating the word lines and the sense amplifiers, wherein at least three memory cells comprising first to third memory cells among the plurality of memory cells are arranged along each of the first bit lines and each of the second bit lines, wherein the first and the second memory cells are each connected to or disconnected from the corresponding first bit line by first and second switching elements among the plurality of switching elements, in accordance with an active or inactive state of first and second word lines among the plurality of word lines, wherein the third memory cell is connected to or disconnected from the corresponding second bit line by a third switching element among the plurality of switching elements, in accordance with an active or inactive state of a third word line among the plurality of word lines, wherein the first memory cell stores a first bit value, the second memory cell stores a second bit value, and the third memory cell stores a third bit value, and wherein the control circuit activates the first to third word lines and then activates the corresponding sense amplifier so that a logical AND operation or a logical OR operation specified by one of the first to third bit values is performed on remaining two of the first to third bit values.

3. The semiconductor memory device according to claim 1, wherein the control circuit receives a row address having a plurality of bits individually selecting from the plurality of word lines, and simultaneously activates or deactivates a predetermined plurality of word lines by ignoring at least one bit of the row address.

4. The semiconductor memory device according to claim 1, wherein the control circuit, when the plurality of word lines are simultaneously activated, at least one of the plurality of word lines that are activated is deactivated before activating the sense amplifier.

5. The semiconductor memory device according to claim 1, wherein the control circuit comprises:

a first active command, for activating the sense amplifier after activating one of the plurality of word lines; and a second active command, for activating the sense amplifier after activating at least two of the plurality of word lines, wherein the semiconductor memory device operates in accordance with both the first active command and the second active command.

6. The semiconductor memory device according to claim 1, wherein the control circuit comprises:

a third active command, which does not automatically activate the sense amplifier after activating one of the plurality of word lines; and a fourth active command, which does not automatically activate the sense amplifier after activating at least two of the plurality of word lines, wherein the semiconductor memory device operates in accordance with both the third active command and the fourth active command.

7. The semiconductor memory device according to claim 1, wherein the control circuit simultaneously performs operations on bit values stored in a plurality of memory cells arranged along a predetermined number of bit lines.

8. The semiconductor memory device according to claim 1, wherein the plurality of bit lines comprise a plurality of first bit lines and a plurality of second bit lines, one sense amplifier among the plurality of sense amplifiers is connected to one of the plurality of first bit lines and one of the plurality of second bit lines, and the control circuit deactivates the sense amplifier after the sense amplifier generates the first bit value, subsequently precharges the first and second bit lines independently to change potentials of the first and the second bit line, and then activates the sense amplifier to generate a bit value obtained by inverting the first bit value.

9. The semiconductor memory device according to claim 1, wherein the semiconductor memory device comprises:

a plurality of memory cell arrays;

at least one sense amplifier array in which a plurality of sense amplifiers is arranged, the plurality of memory cell arrays being arranged such that one sense amplifier row is located between any two vertically adjacent memory cells; and a redundancy circuit comprising at least one word line, and a plurality of memory cells and a plurality of switching elements arranged along the at least one word line, in each of the memory cell arrays.

10. The semiconductor memory device according to claim 1, wherein when a failure in the one memory cell array among the plurality of memory cell arrays is repaired by the redundancy circuit of the one memory cell array, the one memory cell array is operated by the control circuit as an arithmetic circuit, and when the failure in the one memory cell array is repaired by a redundancy circuit of another memory cell array, the operation of the one memory cell array is stopped by the control circuit as the arithmetic circuit.

11. The semiconductor memory device according to claim 9, further comprising:

a register, storing a row address designating a position of one sense amplifier row between any two vertically adjacent memory cells among the plurality of memory cell arrays, wherein the register is readable from outside the semiconductor memory device.

12. The semiconductor memory device according to claim 1, further comprising a record comprising a plurality of bit values indicating at least one attribute is stored in a plurality of memory cells arranged along the bit line, for each of the bit lines.

13. The semiconductor memory device according to claim 12, wherein when a search key comprising a plurality of bit values is input, the control circuit performs a logical AND operation on the bit value stored in the memory cells corresponding to a position of a bit value “1” of the search key, and also performs a logical OR operation on the bit value stored in the memory cells corresponding to a position of a bit value “0” of the search key, so as to search for a record matching the search key from the record stored in the semiconductor memory device.

14. The semiconductor memory device according to claim 12, wherein the control circuit performs a logical XOR operation or a logical XNOR operation between the search key and the record stored in the semiconductor memory device when a search key comprising a plurality of bit values is input, so as to search for a record matching the search key from the record stored in the semiconductor memory device.

15. The semiconductor memory device according to claim 12, wherein

When a search key comprising a plurality of bit values is input, the control circuit searches for a record matching the search key from a first record stored in the semiconductor memory device, and generates, for each of the bit lines, a second record comprising a plurality of bit values, which indicate matching or mismatching between each bit of the first record and a corresponding bit of the search key, so as to determine a matching level between the first record and the search key.

16. A method of manufacturing a semiconductor memory device, where the semiconductor memory device comprises at least one memory cell array comprising a plurality of memory cells arranged alone a plurality of bit lines and a plurality of word lines orthogonal to each other, the method comprising steps of:

forming the plurality of bit lines;

forming the plurality of word lines;

forming the plurality of memory cells;

forming a plurality of switching elements connecting or disconnecting each of the memory cells arranged along a corresponding word line of the word lines to or from a corresponding bit line of the bit lines in accordance with an active state or an inactive state of the corresponding word line;

forming a plurality of sense amplifiers connected to the plurality of bit lines, respectively; and forming a control circuit for activating or deactivating each of the word lines and the sense amplifiers, wherein at least four memory cells comprising first to fourth memory cells among the plurality of memory cells are arranged along a corresponding bit line of the bit lines, wherein the first to fourth memory cells are each connected to or disconnected from one bit line by first to fourth switching elements among the plurality of switching elements, in accordance with active or inactive states of first to fourth word lines among the plurality of word lines, wherein the first memory cell stores a first bit value, the second memory cell stores a second bit value, and the third and fourth memory cells each store a third bit value, and wherein the control circuit activates the third and fourth word lines, then deactivates the third and fourth word lines, subsequently activates the first and second word lines, and then activates the corresponding sense amplifier so that a logical AND operation or a logical OR operation specified by the third bit value is performed on the first and second bit values.

17. The method according to claim 16, further comprising:

forming a plurality of memory cell arrays and at least one sense amplifier row in which a plurality of sense amplifiers are arranged so that one sense amplifier row is positioned between any two vertically adjacent memory cells;

forming a redundant circuit, comprising at least one word line, a plurality of memory cells and a plurality of switching elements arranged along the at least one word line, in each of the memory cell arrays;

operating one of the memory cell arrays as an arithmetic circuit when a failure in the one memory cell array is repaired by a redundancy circuit of the one memory cell array; and stopping the operation of the one memory cell array as an arithmetic circuit when a failure in the one memory cell array among the plurality of memory cell arrays is repaired by a redundancy circuit of another memory cell array.

18. A data processing method using a semiconductor memory device, said semiconductor memory device, comprising:

at least one memory cell array, comprising a plurality of memory cells arranged along a plurality of word lines and a plurality of bit lines orthogonal to one another, a plurality of switching elements, for connecting or disconnecting each of the memory cells arranged along a corresponding word line of the word lines to or from a corresponding bit line of the bit lines in accordance with an active or inactive state of the corresponding word line;

a plurality of sense amplifiers, connected to the plurality of bit lines, respectively; and a control circuit, for activating or deactivating the word lines and the sense amplifiers, wherein at least four memory cells comprising first to fourth memory cells among the plurality of memory cells are arranged along a corresponding bit line of the bit lines, wherein the first to fourth memory cells are each connected to or disconnected from one bit line by first to fourth switching elements among the plurality of switching elements, in accordance with an active or inactive state of first to fourth word lines among the plurality of word lines, wherein the first memory cell stores a first bit value, the second memory cell stores a second bit value, and the third and fourth memory cells each store a third bit value, and wherein the control circuit activates the third and fourth word lines, then deactivates the third and fourth word lines, subsequently activates the first and second word lines, and then activates the corresponding sense amplifiers so that a logical AND operation or a logical OR operation specified by the third bit value is performed on the first and second bit values;

storing a record comprising a plurality of bit values indicating at least one attribute in a plurality of memory cells arranged along the bit line, for each of the bit lines.

19. The method according to claim 18, further comprising:

receiving a search key comprising a plurality of bit values;

performing a logical multiplication operation on the bit value stored in the memory cell corresponding to a position of a bit value “1” of the search key, and performing a logical OR operation on the bit value stored in the memory cell corresponding to a position of a bit value “0” of the search key.

20. The method according to claim 18, further comprising:

receiving a search key comprising a plurality of bit values; and performing a logical XOR operation or a logical XNOR operation between the search key and a record stored in the semiconductor memory device.

21. The method according to claim 18, further comprising:

receiving a search key comprising a plurality of bit values;

searching for a record matching the search key from a first record stored in the semiconductor memory device;

generating a second record comprising a plurality of bit values indicating matching or mismatching between each bit of the first record and a corresponding bit of the search key, for each of the bit lines; and sorting each bit of the second record to determine a matching level between the first record and the search key.

* * * * *